US011575390B2

(12) United States Patent
Lam et al.

(10) Patent No.: US 11,575,390 B2
(45) Date of Patent: Feb. 7, 2023

(54) LOW-LATENCY SEGMENTED QUASI-CYCLIC LOW-DENSITY PARITY-CHECK (QC-LDPC) DECODER

(71) Applicant: Hong Kong Applied Science and Technology Research Institute Co., Ltd., Shatin (HK)

(72) Inventors: Hing-Mo Lam, Tseung Kwan O (HK); Hin-Tat Chan, Quarry Bay (HK); Ying-Lun Tsui, Ma On Shan Nt (HK); Zhonghui Zhang, Shatin (HK); Man-Wai Kwan, Shatin (HK); Kong-Chau Tsang, KLN (HK)

(73) Assignee: Hong Kong Applied Science and Technology Research Insitute Co., Ltd., Shatin (HK)

( * ) Notice: Subject to any disclaimer, the term of this patent is extended or adjusted under 35 U.S.C. 154(b) by 0 days.

(21) Appl. No.: 17/367,195

(22) Filed: Jul. 2, 2021

(65) Prior Publication Data

US 2023/0006694 A1    Jan. 5, 2023

(51) Int. Cl.
  *H03M 13/11*       (2006.01)
  *H03M 13/00*       (2006.01)
(52) U.S. Cl.
  CPC ...... *H03M 13/1134* (2013.01); *H03M 13/116* (2013.01); *H03M 13/1114* (2013.01); *H03M 13/6522* (2013.01)
(58) Field of Classification Search
  None
  See application file for complete search history.

(56) References Cited

U.S. PATENT DOCUMENTS 5,650,781 A    7/1997  Park
6,957,375 B2 * 10/2005  Richardson .......... H03M 13/116
                                                714/752
(Continued)

FOREIGN PATENT DOCUMENTS

CN        1454347 A     11/2003
CN      105680877 A      6/2016
(Continued)

OTHER PUBLICATIONS

Patent Cooperation Treaty, International Search Report and Written Opinion issued for PCT Application No. PCT/CN2021/104984, dated Mar. 29, 2022, 8 pages.
(Continued)

*Primary Examiner* — Steve N Nguyen
(74) *Attorney, Agent, or Firm* — Norton Rose Fulbright US LLP

(57) ABSTRACT

Systems and methods which provide parallel processing of multiple message bundles for a codeword undergoing a decoding process are described. Embodiments provide low-latency segmented quasi-cyclic low-density parity-check (QC-LDDC) decoder configurations in which decoding process tasks are allocated to different segments of the low-latency segmented QC-LDPC decoder for processing multiple bundles of messages in parallel. A segmented shifter of a low-latency segmented QC-LDPC decoder implementation may be configured to process multiple bundles of a plurality of edge paths in parallel. Multiple bundles of messages of a same check node cluster (CNC) are processed in parallel. Additionally, multiple bundles of messages of a plurality of CNCs are processed in parallel.

15 Claims, 24 Drawing Sheets

(56) References Cited

U.S. PATENT DOCUMENTS

| | | | |
|---|---|---|---|
| 7,451,374 B2* | 11/2008 | Kim | H03M 13/116 714/748 |
| 7,724,770 B2* | 5/2010 | Lee | H04L 12/4625 370/503 |
| 7,814,393 B2 | 10/2010 | Kyung et al. | |
| 8,612,835 B2 | 12/2013 | Yokokawa | |
| 8,713,399 B1* | 4/2014 | Tsatsaragkos | H03M 13/1111 714/752 |
| 8,739,001 B2 | 5/2014 | Tsatsaragkos et al. | |
| 9,112,530 B2 | 8/2015 | Gunnam et al. | |
| 9,509,342 B2* | 11/2016 | Vernon | H03M 13/1108 |
| 9,537,510 B2 | 1/2017 | Motozuka et al. | |
| 9,933,996 B2* | 4/2018 | Chaudhuri | G06F 5/01 |
| 10,116,333 B2* | 10/2018 | Zamir | H03M 13/1105 |
| 10,484,009 B2* | 11/2019 | Fan | H03M 13/1137 |
| 2004/0187129 A1* | 9/2004 | Richardson | H03M 13/1168 718/100 |
| 2008/0148128 A1* | 6/2008 | Sharon | H03M 13/114 714/780 |
| 2008/0294969 A1* | 11/2008 | Divsalar | H04L 1/0057 714/801 |
| 2009/0274138 A1 | 11/2009 | Glickman et al. | |
| 2010/0179975 A1 | 7/2010 | Liao et al. | |
| 2013/0139024 A1* | 5/2013 | Nguyen | H03M 13/1168 714/752 |
| 2014/0181624 A1 | 6/2014 | Podkolzin et al. | |
| 2014/0229789 A1* | 8/2014 | Richardson | H03M 13/036 714/752 |
| 2015/0229330 A1* | 8/2015 | Motozuka | H03M 13/6527 714/752 |
| 2020/0249909 A1 | 8/2020 | Lam et al. | |
| 2020/0252080 A1 | 8/2020 | Lam et al. | |

FOREIGN PATENT DOCUMENTS

| | | |
|---|---|---|
| CN | 106452455 A | 2/2017 |
| CN | 107370489 A | 11/2017 |
| CN | 110710111 A | 1/2020 |
| WO | WO-2018029633 A1 | 2/2018 |
| WO | WO-2018127196 A1 | 7/2018 |

OTHER PUBLICATIONS

Wang, G. et al. "A Massively Parallel Implementation of QC-LDPC Decoder on GPU," 2011 IEEE 9th Symposium on Application Specific Processors, Jul. 2011, 4 pages.

Mediatek Inc. Implementation considerations on flexible and efficient LDPC decoders. 3GPP (3rd Generation Partnership Project), TSG-RAN WG1 #86bis, R1-1609337, Oct. 2016, 8 pages.

Zte et al. Complexity, throughput and latency considerations on LDPC codes for eMBB. 3GPP (3rd Generation Partnership Project), TSG RAN WG1 Meeting #88, R1-1701599, Feb. 2017, 12 pages.

Das, S. et al. "A Timing-Driven Approach to Synthesize Fast Barrel Shifters," IEEE Transactions on Circuits and Systems—II: Express Briefs, vol. 55, No. 1, Jan. 2008, 5 pages.

Chen, X. et al. "QSN—A Simple Circular-Shift Network for Reconfigurable Quasi-Cyclic LDPC Decoders," IEEE Transactions on Circuits and Systems—II: Express Briefs, vol. 57, No. 10, Oct. 2010, 5 pages.

Hong, J.-H. et al. "Parallel LDPC Decoding on a Heterogeneous Platform Using OpenCL," KSII Transactions on Internet and Information Systems, vol. 10, No. 6, Jun. 2016, 21 pages.

Mediatek Inc, "On Design and Performance of NR eMBB LDPC Code" R1-1707850, May 15, 2017; 15 pages.

International Search Report and Written Opinion issued for PCT Application No. PCT/CN2019/074599, dated Jul. 5, 2019, 9 pages.

International Search Report and Written Opinion issued for PCT Application No. PCT/CN2019/074532, dated Oct. 30, 2019, 10 pages.

Tsatsaragkos et al. "A Reconfigurable LDPC Decoder Optimized for 802.11n/ac Applications," IEEE Transactions on VLSI Systems, vol. 26, No. 1, Jan. 2018, 14 pages.

Karkooti et al. "Semi-Parallel Reconfigurable Architectures for Real-Time LDPC Decoding," IEEE Proceedings of the International Conference on Information Technology: Coding and Computing, 2004, 7 pages.

Sun et al. "A Low-Power 1-Gbps Reconfigurable LDPC Decoder Design for Multiple 4G Wireless Standards," IEEE International SOC Conference, 2008, 4 pages.

Liu et al. "Design of a Multimode QC-LDPC Decoder Based on Shift-Routing Network," IEEE Transactions on Circuits and Systems, vol. 56, No. 9, Sep. 2009, 5 pages.

Oh et al. "Area Efficient Controller Design of Barrel Shifters for Reconfigurable LDPC Decoders," IEEE International Symposium on Conference: Circuits and Systems, 2008, 4 pages.

* cited by examiner

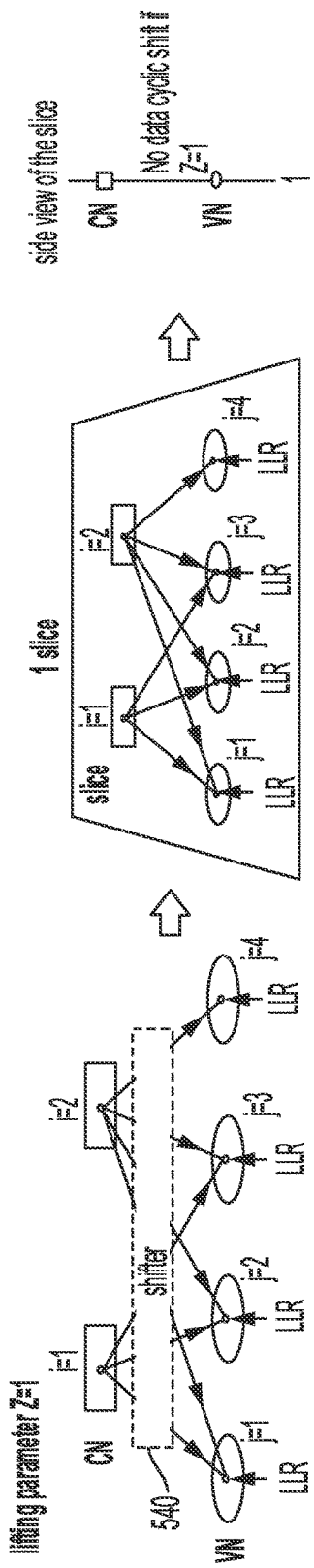
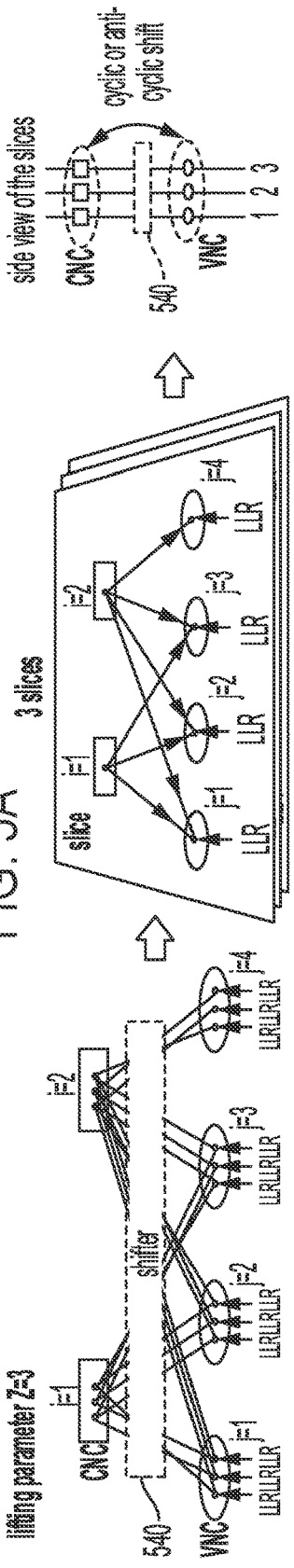
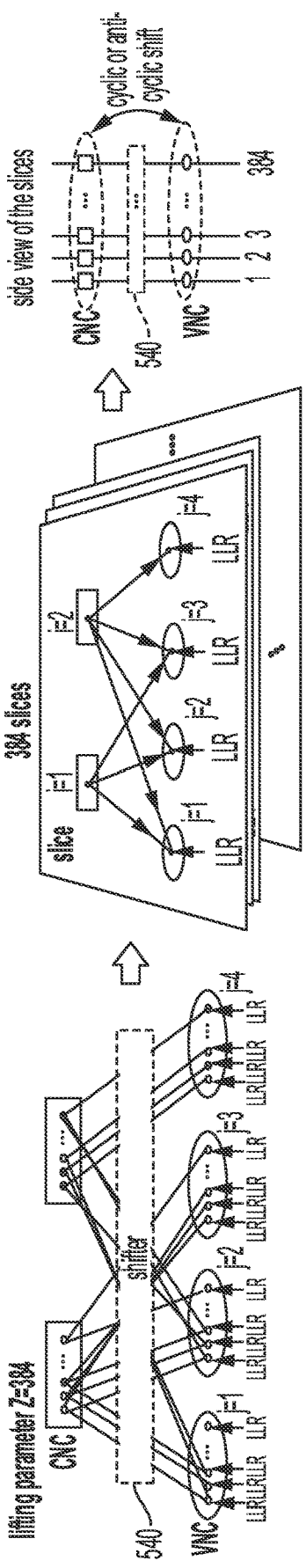
FIG. 5A
FIG. 5B
FIG. 5C

LOW-LATENCY SEGMENTED QUASI-CYCLIC LOW-DENSITY PARITY-CHECK (QC-LDPC) DECODER

TECHNICAL FIELD

The present invention relates generally to data communication and, more specifically, to decoding correction encoded data.

BACKGROUND OF THE INVENTION

Data communications are widely relied upon in today's society for a variety of purposes, such as messaging between individuals, broadcast communications, controlling machinery, networking of processor-based systems, etc. The data may be communicated through various channels, including wireline, wireless, and optical channels, and may be subject to various sources of noise, interference, and/or other signal degradation. In cellular radio systems, for example, wireless transmission is used to convey bits of information between various forms of user equipment (e.g., handsets) and base stations. However, the received bits often differ from the transmitted bits, owing to communication errors caused by noise, interference, or poor signal strength.

Accordingly, a number of forms of data encoding techniques have been developed in an attempt to render the data (e.g., data transmissions of high data rate applications) more resilient to the effects of transmission through various channels (e.g., unreliable or noisy channels). For example, error correction codes (ECCs), such as turbo codes, low-density parity-check (LDPC) codes, etc., have been implemented to encode data for data communication.

A LDPC code is a linear error correcting code. LDPC uses a layered decoding technique, wherein a single block row of parity equations is evaluated in each of a plurality of iterations (the bit values are updated every iteration). A valid codeword is indicated by all parity equations being satisfied. LDPC codes are finding increasing use in applications requiring reliable and highly efficient information transfer over bandwidth-constrained or return-channel-constrained links in the presence of corrupting noise.

In order to solve problems with respect to signal degradation the 5G cellular standard specifies use of LDPC code as the data channel code for cellular communications. In particular, the 5G standard uses quasi-cyclic LDPC (QC-LDPC) coding for data correction code. The 5G QC-LDPC decoder supports 51 different sizes of input codeword. Accordingly, the QC-LDPC decoder comprises a hardware configuration supporting the maximum codeword size. Traditional QC-LDPC decoders can only decode one code block of any size at a time (see e.g., U.S. Pat. Nos. 8,739,001 and 9,112,530, the disclosures of which are incorporated herein by reference). If the input codeword size is not the maximum, the traditional QC-LDPC decoder design has some hardware stay in idle in the decoding process.

Base stations in a 5G network support the communications of multiple users simultaneously. Accordingly, a 5G base station receiver operates to decode multiple codewords (e.g., the QC-LDPC encoded data of multiple user transmissions) with different sizes from various connected terminals. A base station serving multiple users should nevertheless provide high throughput QC-LDPC decoding. The iterative decoding techniques typically implemented with respect to QC-LDPC encoded data are relatively logic intensive, and thus often result in the decoder logic consuming almost half the receiver (e.g., base station) computational power. In operation of traditional QC-LDPC decoder designs, in which decoding is performed separately for the multiple codewords for the connected terminals (e.g., performed by multiple instances of the decoder logic and/or processed serially by repeated operation of an instance of decoder logic), high throughput QC-LDPC decoding is accomplished by an inefficient and resource intensive implementation.

A more recent, non-traditional QC-LDPC decoder design described in U.S. Pat. No. 10,826,529 (the disclosure of which is incorporated herein by reference) provides for more efficient and flexible decoding. In particular, this non-traditional QC-LDPC decoder design facilitates decoding of multiple codewords in parallel (e.g., parallel processing of codewords from multiple different users). Nevertheless, appreciable latencies can be experienced in the decoding process of each codeword as a result of the plurality of message processing steps implemented by the QC-LDPC decoder.

BRIEF SUMMARY OF THE INVENTION

The present invention is directed to systems and methods which provide parallel processing of multiple message bundles for a codeword undergoing a decoding process. Embodiments of the invention provide low-latency segmented quasi-cyclic low-density parity-check (QC-LDPC) decoder configurations in which decoding process tasks (e.g., message processing performed by various nodes) are allocated to different segments of the low-latency segmented QC-LDPC decoder for processing multiple bundles of messages in parallel. A low-latency segmented QC-LDPC decoder of embodiments may utilize a segmented shifter implementation configured for bundling edges (e.g., connections between variable nodes (VNs) and check nodes (CNs)) of one or more check node clusters (CNCs) of the low density segmented QC-LDPC decoder.

A segmented shifter of a low-latency segmented QC-LDPC decoder implementation may be configured to process multiple bundles of a plurality of edge paths (e.g., bundles of Z number of edges) in parallel, wherein a sum of the edge paths of the multiple bundles of edge paths in the low-latency segmented QC-LDPC decoder implementation is less than or equal to the segmented shifter size (e.g., $Z_1+Z_2+\ldots Z_M \leq Z\text{max}$). Embodiments of the invention may thus be well suited for small size signaling data which uses small codeword size, such as various instances of vehicle-to-everything (V2X) communications requiring low-latency and reliable communication services.

In operation of a low-latency segmented QC-LDPC of embodiments, multiple bundles of messages of a same CNC are processed in parallel. Accordingly, a plurality of decoding processing steps that are traditionally performed serially are instead processed in parallel, reducing the decoding latency for decoding codeword data (e.g., small size signaling data which uses small codeword size). Additionally, in operation according to some embodiments of a low-latency segmented QC-LDPC, multiple bundles of messages of a plurality of CNCs are processed in parallel. Such embodiments further increase the number of decoding processing steps that are processed in parallel, and thus may further reduce the decoding latency for decoding codeword data.

Low-latency segmented QC-LDPC decoders of embodiments are configured to provide an efficient and flexible design for parallel processing. For example, in addition to which provide parallel processing of multiple message bundles for a codeword, embodiments of a low-latency segmented QC-LDPC decoder may process multiple bundles of edges of a plurality of codewords in parallel.

Embodiments of low-latency segmented QC-LDPC decoders may utilize configurations which an efficient hardware implementation that supports partitioning and allocating decoding process tasks to different segments while nevertheless facilitating scalability with respect to the sizes of codewords supported. For example, a sectioned configuration of a segmented shifter, in which each of the left shift and right shift portions are divided into multiple sections sharing the same control signals, may be utilized by a low-latency segmented QC-LDPC decoder of some embodiments. Such configurations may accommodate a satisfactory tradeoff between the number of segments supported and the hardware cost.

The foregoing has outlined rather broadly the features and technical advantages of the present disclosure in order that the detailed description that follows may be better understood. Additional features and advantages will be described hereinafter which form the subject of the claims herein. It should be appreciated by those skilled in the art that the conception and specific embodiments disclosed may be readily utilized as a basis for modifying or designing other structures for carrying out the same purposes of the present designs. It should also be realized by those skilled in the art that such equivalent constructions do not depart from the spirit and scope as set forth in the appended claims. The novel features which are believed to be characteristic of the designs disclosed herein, both as to the organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following descriptions taken in conjunction with the accompanying drawing, in which:

FIGS. 5A-5C show slice views for respective Tanner graph constructions of example LDPC codes;

FIGS. 15A-1, 15A-2, and 15B-15E show detail with respect to an implementation of a low-latency segmented QC-LDPC decoder of embodiments of the present invention.

DETAILED DESCRIPTION OF THE INVENTION

Figure 1:
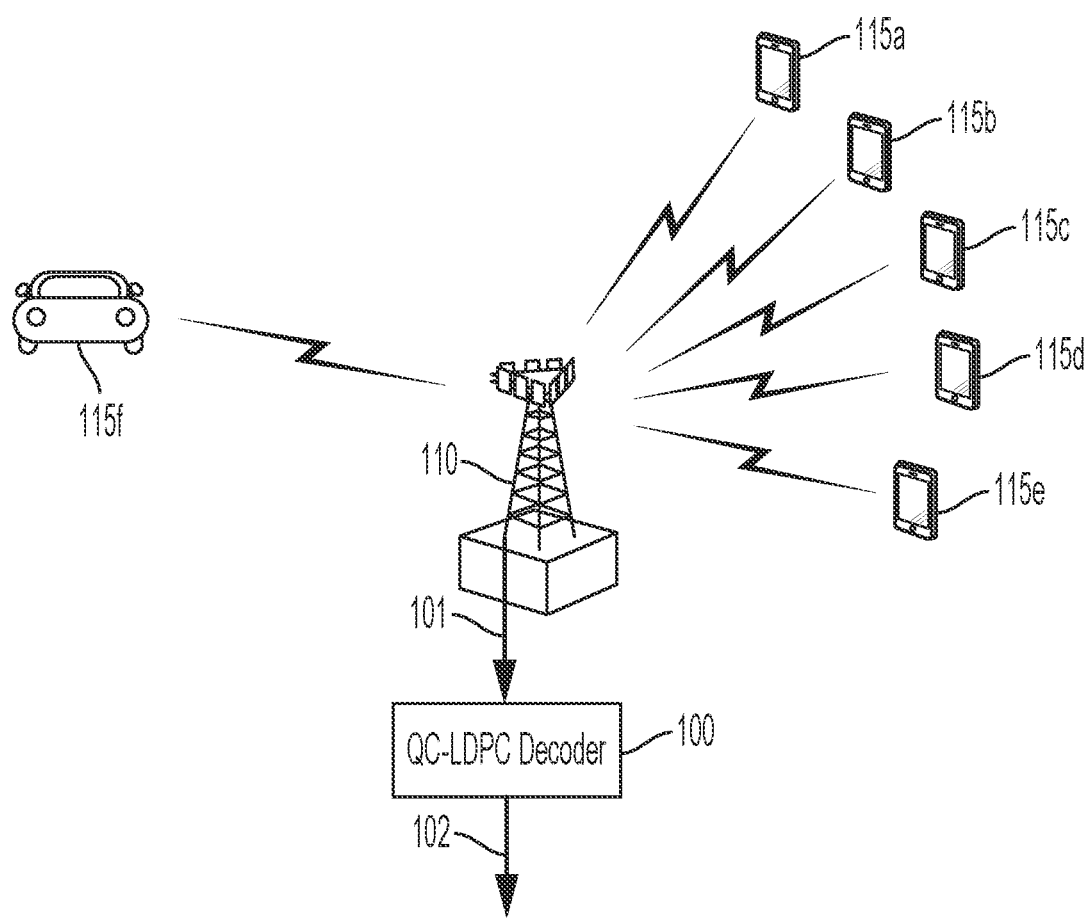
FIG. 1 shows a portion of a wireless network in which low-latency segmented quasi-cyclic low-density parity-check (QC-LDPC) decoder configurations of embodiments of the present invention may be utilized.

FIG. 1 shows a portion of a wireless network (e.g., a portion of a 5G cellular network) in which a base station supports the communications of multiple users simultaneously. In particular, FIG. 1 shows base station 110 supporting wireless communication with user devices 115a-115f. User devices 115a-115f may, for example, comprise various forms of user equipment (e.g., user devices 115a-115e provided in the form of smart phone handsets, user device 115f provided in the form of a smart vehicle, etc.).

Devices communicating within the wireless network illustrated in FIG. 1 implement a quasi-cyclic low-density parity-check (QC-LDPC) data encoding technique to provide data correction coding rendering the data more resilient to the effects of transmission through the often noisy wireless channels. Accordingly, base station 110 of the illustrated example is shown implementing QC-LDPC decoder 100 configured to decode QC-LDPC encoded data of the user transmissions. For example, codewords (e.g., code blocks that may be corrupted due to noise and/or other degradation experienced in the wireless channel) as received from user devices 115a-115f by base station 110 are input to QC-LDPC decoder 100 as soft bits or log-likelihood ratio (LLR) values at input 101. QC-LDPC decoder 100 performs an iterative decoding technique in which a block row of parity equations is evaluated in each of a plurality of iterations to converge on a decoded codeword. The hard bits of a decoded codeword are output by QC-LDPC decoder 100 at output 102.

Figure 2A:
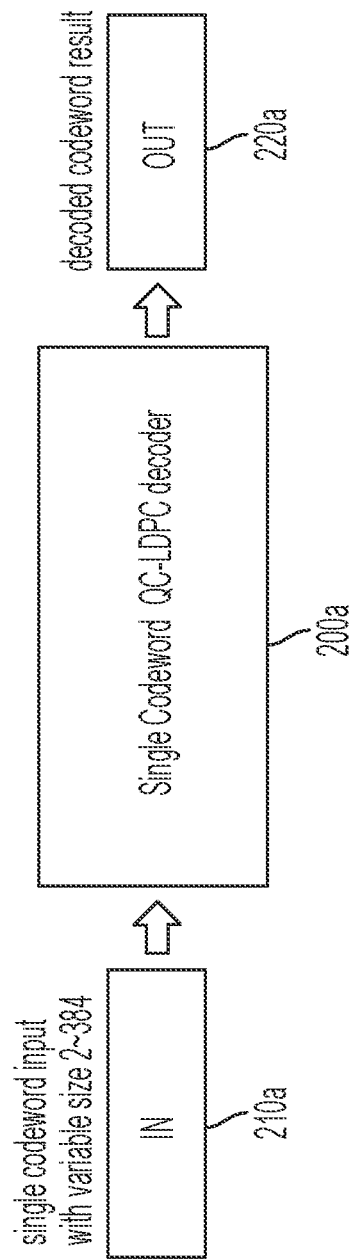
FIGS. 2A and 2B show examples of existing QC-LDPC decoder configurations.
Figure 2B:
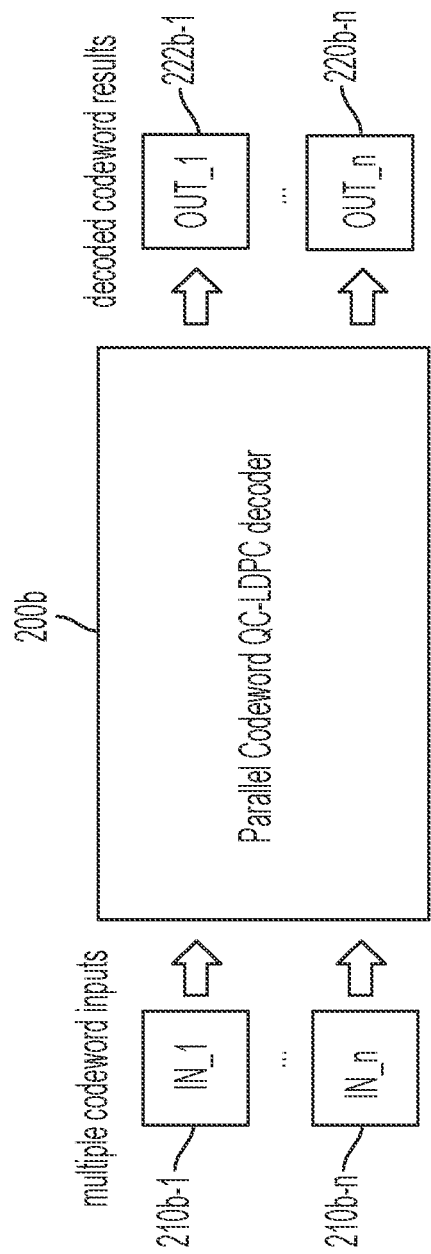

FIGS. 2A and 2B show examples of existing QC-LDPC configurations that may be implemented to decode QC-LDPC encoded data of the transmissions within the wireless network illustrated in FIG. 1. In particular, as described in further detail below, single codeword QC-LDPC decoder 200a of FIG. 2A comprises a traditional QC-LDPC decoder configuration (e.g., corresponding to decoder configurations shown in U.S. Pat. Nos. 8,739,001 and 9,112,530) and parallel codeword QC-LDPC decoder 200b of FIG. 2B comprises a more recent QC-LDPC decoder configuration (e.g., corresponding to decoder configurations shown in U.S. Pat. No. 10,826,529). Single codeword QC-LDPC decoder 200a or parallel codeword QC-LDPC coder 200b may, for example, be utilized in an implementation of QC-LDPC decoder 100 in the wireless network of FIG. 1.

Referring first to FIG. 2A, a traditional QC-LDPC decoder commonly used by receivers in 5G cellular networks to decode data encoded using QC-LDPC code for data correction is shown. Single codeword QC-LDPC decoder 200a of FIG. 2A comprises a 5G QC-LDPC error correction code decoder operable to receive encoded bits provided by received noisy signal 210a (e.g., in LLR), and output decoded bits as decoded result 220a. In operation, single codeword AC-LDPC decoder 200a implements layered decoding logic for iteratively processing parity equations with respect to a single code block (e.g., codeword) of the encoded bits, wherein a valid codeword is indicated by all parity equations being satisfied.

The input to single codeword QC-LDPC decoder 200a is a code block having a size dependent upon various factors. In 5G cellular networks according to current standards, base graph (BG) matrixes BG1 and BG2 are the two sizes of BG matrixes, wherein BG1=46×68 and BG2=42×52. BG1 has eight different matrixes for different values of lifting parameter Z and BG2 has another eight different matrixes for different values of lifting parameter Z, as shown in the table below. As can be seen from the table below, the lifting parameter $Z=\{2, \ldots, 384\}$ in this 5G cellular network example. The bit-width (K) of LLR is often 6 or 8 bits, although other bit-widths may be used. The code block size in 5G cellular network implementations is proportional to the value of lifting parameter Z (e.g., the size of the lifting parameter Z is small if the codeword size is small). Using the 5G BG1 and K=8 bits configuration as an example, the code block size of the single codeword QC-LDPC decoder input=K*68*Z, wherein the code block may generally range from 816 bits (e.g., where LLR bit-width K=6 and lifting parameter Z=2) to 208,896 bits (e.g., where LLR bit-width K=8 and lifting parameter Z=384).

| Set index ($i_{LS}$) (Index of BG Matrix) | Set of lifting parameter sizes (Z) (Value of Z Corresponding to BG Matrix Index) |
| --- | --- |
| 0 | {2, 4, 8, 16, 32, 64, 128, 256} |
| 1 | {3, 6, 12, 24, 48, 96, 192, 384} |
| 2 | {5, 10, 20, 40, 80, 160, 320} |
| 3 | {7, 14, 28, 56, 112, 224} |
| 4 | {9, 18, 36, 72, 144, 288} |
| 5 | {11, 22, 44, 88, 176, 352} |
| 6 | {13, 26, 52, 104, 208} |
| 7 | {15, 30, 60, 120, 240} |

The output of single codeword QC-LDPC decoder 200a comprises decoded bits (hard bit) derived from a code block input, wherein this output is also proportional to the value of lifting parameter Z. Continuing with the 5G BG1 example, output (D bits) of the single codeword QC-LDPC decoder (hard bit)=68*Z (e.g., D=136 bits where the lifting parameter Z=2 to D=26,112 bits where the lifting parameter Z=384). Accordingly, implementations of single codeword QC-LDPC decoder 200a configured for use with respect to 5G BG1 must be configured to accommodate lifting parameter Z=384, although QC-LDPC decoding of code blocks using smaller lifting parameters (i.e., lifting parameter Z<384) may nevertheless be processed with the remaining capacity of the single codeword QC-LDPC decoder remaining idle (e.g., the idle portion of a traditional QC-LDPC decoder is almost inversely proportional to the value of the lifting parameter Z used).

It can be appreciated from the foregoing that single codeword QC-LDPC decoder 200a can only decode one code block or codeword at a time. Additional code blocks are separately decoded (e.g., by multiple instances of single codeword QC-LDPC decoder 200a and/or by repeated operation of single codeword QC-LDPC decoder 200a) by this traditional configuration (e.g., one code block of any size of $Z=\{2, \ldots, 384\}$). Accordingly, in order to decode codewords for the communications of multiple devices (e.g., user devices 115a-115f of FIG. 1), multiple codes words may be processed serially by single codeword QC-LDPC decoder 200a and/or multiple instances of single codeword QC-LDPC decoder 200a may be implemented in parallel. Supporting the communications of multiple users simultaneously (e.g., base station 110 serving a plurality of user devices of user devices 115a-115f) often requires high throughput of the QC-LDPC decoder. Accordingly, many usage scenarios may necessitate the hardware and/or processor intensive solution of implementing multiple instances of the single codeword QC-LDPC decoder.

Referring now to FIG. 2B, a more recent QC-LDPC decoder configuration as may be used by receivers in 5G cellular networks to decode data encoded using QC-LDPC code for data correction is shown. Parallel codeword QC-LDPC decoder 200b is configured to receive encoded bits provided by a plurality of received signals 210b-1 through 210b-n (e.g., bits in the LLR domain transmitted by a plurality of connected terminals, such as user devices 115a-115f of FIG. 1), and output decoded bits (e.g., hard bits) as decoded results 220-1 through 220-n (e.g., corresponding to the decoded code blocks for a plurality of connected terminals).

The codewords decoded in parallel by parallel codeword QC-LDPC decoder 200b have a total combined or aggregated lifting parameter size that is less than or equal to the maximum lifting parameter size utilized with respect to the encoded data. For example, in a 5G BG1 configuration where Z=384, the n codewords decoded by parallel codeword QC-LDPC decoder 200b have a total combined lifting parameter size (e.g., ZIN_1+ZIN_2+ . . . ZIN_n) that is less than or equal to Z (i.e., 384 in this example). The overall input of the parallel codeblock QC-LDPC decoder may be formed by combining code blocks that are using the same BG matrix index (e.g., the table above), wherein such code blocks may be of the same or different sizes. For example, to use the same BG matrix, code blocks with value of Z from the same BG matrix index set may be used (e.g., combine code blocks with $Z=\{15, 30, 60, 120 \text{ and } 240\}$, where all those code blocks use the BG matrix index 7).

It can be appreciated from the foregoing that parallel codeword QC-LDPC decoder 200b facilitates higher QC-LDPC decoder throughput than a single instance of single codeword QC-LDPC decoder 200a, such as for simultaneously supporting the communications of multiple users. However, as will be better understood from the description below, appreciable latencies can be experienced in the decoding process of each codeword as a result of the plurality of message processing steps implemented by the QC-LDPC decoder. Accordingly, neither single codeword QC-LDPC decoder 200a nor parallel codeword QC-LDPC decoder 200b may be particularly well suited for applications requiring low latency, such as vehicle-to-everything (V2X) communications. Low-latency segmented QC-LDPC decoder configurations, in which decoding process tasks are allocated to different segments of the low-latency segmented QC-LDPC decoder for processing multiple bundles of messages in parallel, provided in accordance with concepts of the present invention facilitate low-latency decoding of codewords (e.g., speeding up the decoding process by implementing parallel processing of bundles of messages of a codeword being decoded).

To aid in understanding concepts of the present invention, it is helpful to understand LDPC decoding operation. LDPC is a linear block code that uses a layered decoding technique, wherein a single block row of parity equations is evaluated in each of a plurality of iterations (the bit values are still updated every iteration) and a valid codeword is indicated by all parity equations being satisfied. Being a linear block code, LDPC codes may be descried via matrices. LDPC codes may also be described using graphical representations (e.g. Tanner graphs).

Figure 3A:
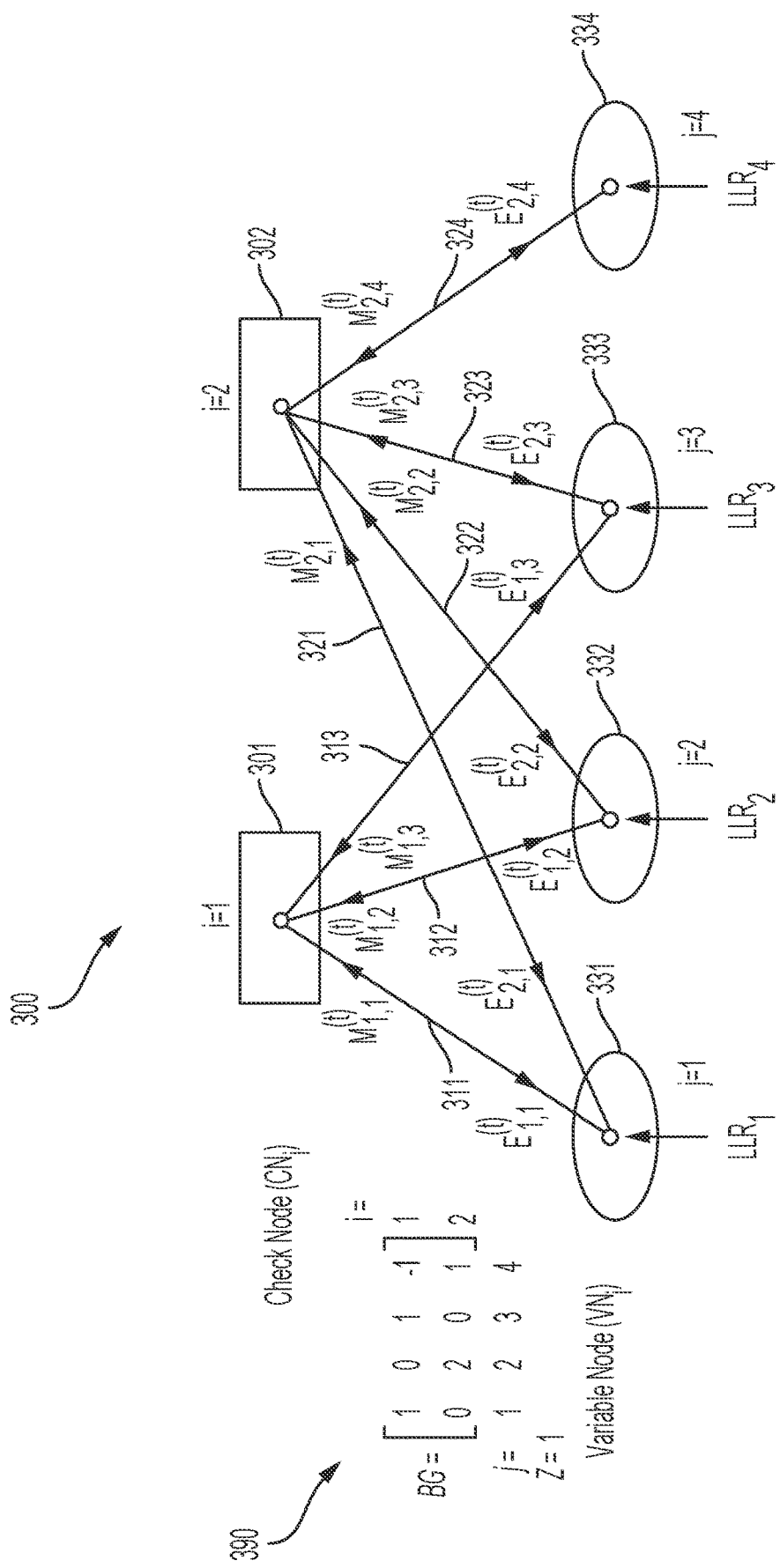
FIG. 3A shows a base graph (BG) matrix and a Tanner graph construction for an example of a QC-LDPC decoder.

LDPC codes used according to current 5G cellular standards comprise quasi-cyclic LDPC (QC-LDPC) codes. QC-LDPC codes are characterized by two parameters, namely lifting factor (Z) and base graph (BG) matrix. FIG. 3A shows both a BG matrix and corresponding Tanner graph construction for an example of a QC-LDPC code using 2 check nodes (CNs) and 4 variable nodes (VNs). It should be appreciated that the LDPC code of the illustrated example includes only 2 CNs and 4 VNs to simplify the description. The LDPC codes for which parallel LDPC decoding may be provided by embodiments of the invention are likely to be much larger than this example. For example, in the 5G cellular communication standard the size of BG1 is currently 46×68 (e.g., 46 check nodes and 68 variable nodes) and the size of BG2 is currently 42×52 (e.g., 42 check nodes and 52 variable nodes).

It can be seen that Tanner graph 300 of FIG. 3A represents the same LDPC code as matrix of BG matrix 390

$$\left(BG = \begin{pmatrix} 1 & 0 & 1 & -1 \\ 0 & 2 & 0 & 1 \end{pmatrix}\right),$$

wherein the BG matrix rows correspond to the Tanner graph CNs (shown as CNs 301 and 302, wherein row i=1 corresponds to CN 301 and row i=2 corresponds to CN 302) and the BG matrix columns correspond to the Tanner graph VNs (shown as VNs 331-334, wherein column j=1 corresponds to VN 331, column j=2 corresponds to VN 332, column j=3 corresponds to VN 333, and column j=4 corresponds to VN 334). Tanner graph 300 includes edges (e.g., shown as edges 311-313 and 321-324) providing connections between the nodes of the different node sets over which messages are passed in operation of the codeword decoding processing. In particular, $CN_i$ is connected to $VN_j$ if the element $BG_{i,j}$ is non-negative (i.e., a negative entry in BG matrix 390 corresponds to no connection or edge between the respective VN and CN in the Tanner graph). The messages passed between the nodes of the Tanner graph are indicated as $M_{i,j}^{(t)}$, representing a VN to CN message passing from $VN_j$ to $CN_i$ at iteration t, and $E_{i,j}^{(t)}$, representing a CN to VN message passing from $CN_i$ to $VN_j$ at iteration t. The value of the elements of BG matrix 390 represent the cyclic shift value utilized in the iterative decoding process (e.g., a BG matrix value of 0 corresponds to no shift, a BG matrix value of 1 corresponds to a cyclic shift of 1 place, a BG matrix value of 2 corresponds to a cyclic shift of 2 places, etc.).

In operation according to a traditional LDPC decoding process (e.g., QC-LDPC decoding), decoding is done by sequentially passing messages (e.g., $M_{i,j}^{(t)}$) from VN to CN (V2C), then messages (e.g., $E_{i,j}^{(t)}$) from CN to VN (C2V), one CN by one CN. This LDPC decoding operation is illustrated in the Tanner graph instances of FIG. 3B, wherein one iteration of a LDPC decoding operation is shown. In the illustrated LDPC decoding iteration instance, in providing operation for message passing with respect to a first one of the CNs, Tanner graph 300-1 shows V2C operation passing the messages from VNs 331-333 to CN 301 (e.g., message passing steps whereby message $M_{1,1}^{(t)}$ is passed from VN 331 to CN 301, message $M_{1,2}^{(t)}$ is passed from VN 332 to CN 301, and then message $M_{1,3}^{(t)}$ is passed from VN 333 to CN 301) and Tanner graph 300-2 shows a C2V operation passing the massage from CN 301 to VNs 331-333 (e.g., message passing steps whereby message $E_{1,1}^{(t)}$ is passed from CN 301 to VN 331, message $E_{1,2}^{(t)}$ is passed from CN 301 to VN 332, and then message $E_{1,3}^{(t)}$ is passed from CN 301 to VN 333). It should be appreciated that either a C2V operation to initially pass the message from CN 301 to VNs 311-333 or a prior iteration of LDPC decoding has been performed with respect to the LDPC decoding operation shown in Tanner graph 300-1. In providing operation for message passing with respect to the next one of the CNs, Tanner graph 300-3 shows V2C operation passing the message from VNs 331-334 to CN 302 (e.g., message passing steps whereby message $M_{2,1}^{(t)}$ is passed from VN 331 to CN 302, message $M_{2,2}^{(t)}$ is passed from VN 332) to CN 302, message $M_{2,3}^{(t)}$ is passed from VN 333 to CN 302, and then message $M_{2,4}^{(t)}$ is passed from VN 334 to CN 302) and Tanner graph 300-4 shows a C2V operation passing the massage from CN 302 to VNs 331-334 (e.g., message passing steps whereby message $E_{2,1}^{(t)}$ is passed from CN 302 to VN 331, message $E_{2,2}^{(t)}$ is passed from CN 302 to VN 332, message is passed from CN 302 to VN 333, and then message $E_{2,4}^{(t)}$ is passed from CN 302 to VN 334).

Logic of the LDPC decoder implements algorithms to decode the LDPC codes in the aforementioned C2V and V2C operations. A LDPC decoder algorithm utilized by a LDPC decoder may, for example, comprise the min-sum algorithm, the sum-product algorithm, the belief propagation algorithm, or the message passing algorithm. To aid in understanding concepts of the present invention, examples utilizing the min-sum algorithm will be discussed. It should be appreciated, however, that the concepts herein are not limited to application with respect to the LDPC decoder algorithm of this example.

Figure 3B:
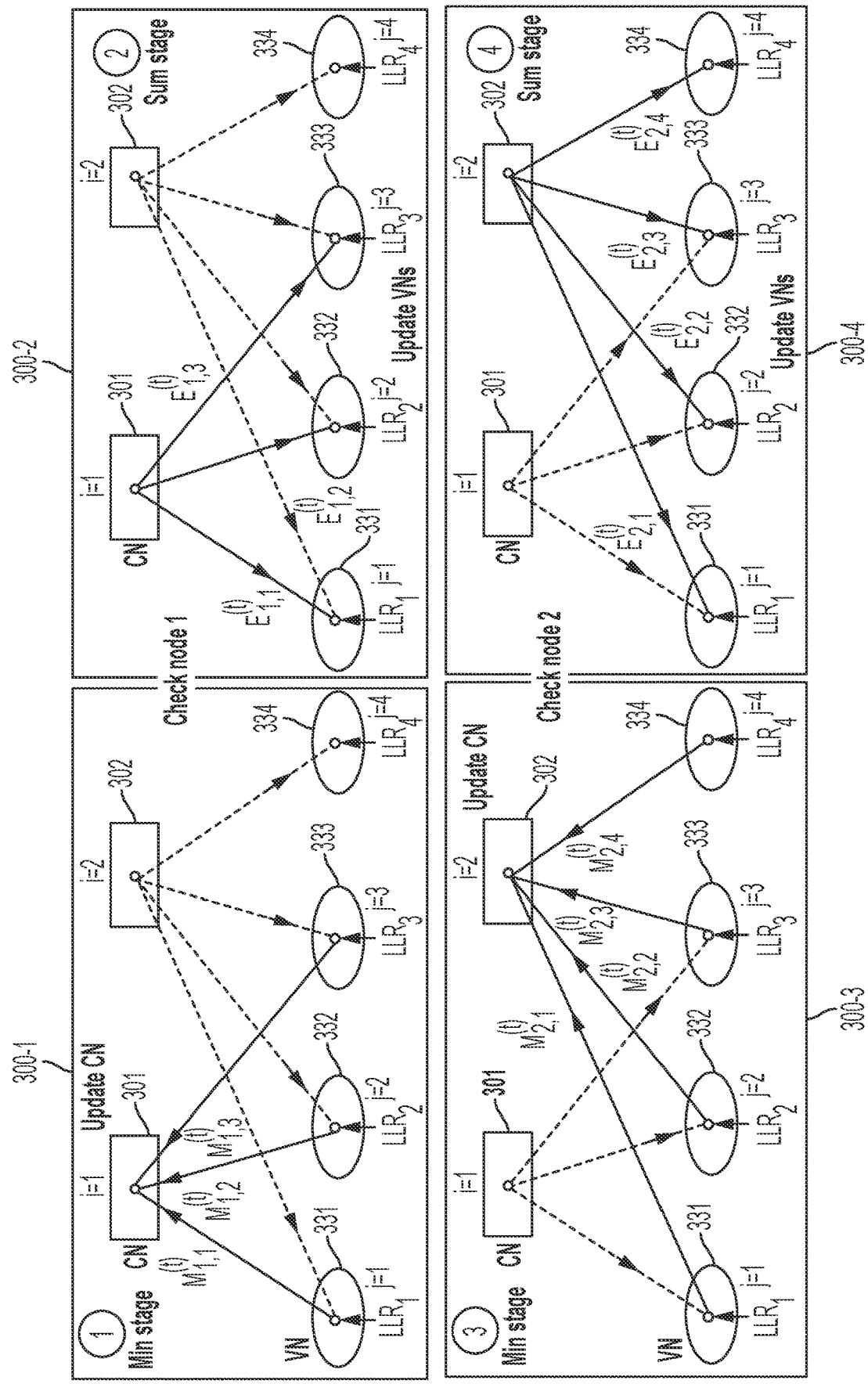
FIG. 3B shows operation according to an iterative QC-LDPC decoding process.
Figure 3C:
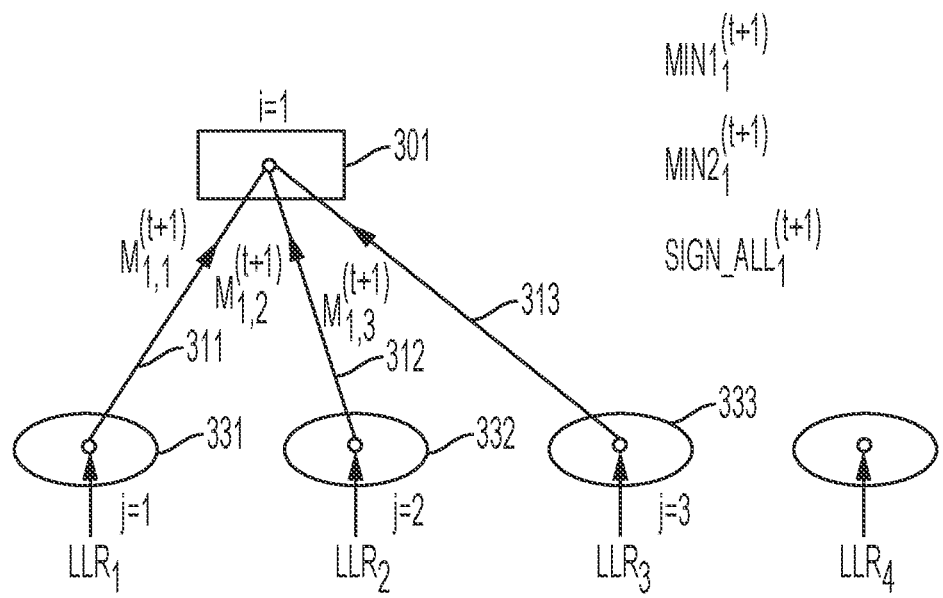
FIGS. 3C and 3D show min stage operation with respect to a QC-LDPC decoder utilizing the min-sum algorithm, showing variable node to check node (V2C) operation of a QC-LDPC decoder.

In operation of a LDPC decoder utilizing the min-sum algorithm, a min stage is utilized in the V2C operation when passing messages (e.g., $M_{i,j}^{(t+1)}$) from the VNs to the CNs, as shown in FIG. 3C. As shown in the illustrated embodiment, logic of the LDPC decoder (e.g., using comparator logic) may determine a first minimum with respect to the messages passed from the VNs connected to a CN (e.g., $MIN1_1^{(t+1)}=1^{st}$ minimum of abs ($M_{1,1}^{(t+1)}$, $M_{1,2}^{(t+1)}$, $M_{1,3}^{(t+1)}$ and a second minimum with respect to the messages passed from the VNs connected to the CN (e.g., $MIN2_1^{(t+1)}=2^{nd}$ minimum of abs ($M_{1,1}^{(t+1)}$, $M_{1,2}^{(t+1)}$, $M_{1,3}^{(t+1)}$)). Logic of the LDPC decoder (e.g., using XOR gate logic) may further determine a sign for the messages passed from the VNs connected to the CN (e.g., $SIGN\_ALL_1^{(t+1)}=\text{sign}(M_{1,1}^{(t+1)})$ XOR $\text{sign}(M_{1,2}^{(t+1)})$ XOR sign $(M_{1,3}^{(t+1)})$, wherein sign=1 means negative). The messages passed from the connected VNs may be computed by logic of the LDPC decoder (e.g., using arithmetic logic) from the data previously provided in the messages passed from the CN in a prior iteration of the decoding.

The V2C messages may be computed as follows:

$$M_{i,j}^{(t)} = LLR_j + \sum_{i' \in V \setminus \{i\}} E_{i',j}^{(t)}$$

Figure 3D:
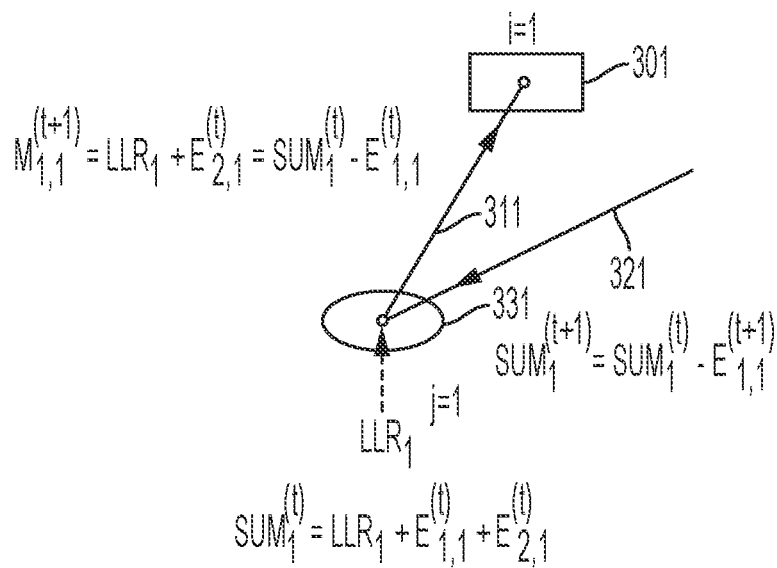

As shown in FIG. 3D, the message passed from VN 331 to CN 301 may, for example, be computed as $M_{1,1}^{(t+1)} = LLR_1 + E_{2,1}^{(t)} = SUM_1^{(t)} - E_{1,1}^{(t)}$, wherein $SUM_1^{(t)} = LLR_1 + E_{1,1}^{(t)} + E_{2,1}^{(t)}$ and $SUM_1^{(t+1)} = SUM_1^{(t)} - E_{1,1}^{(t+1)}$ (initially all $E_{i,j}^{(t)} = 0$ and all $SUM_j = LLR_j$). The messages passed from each of the other connected VNs may be similarly computed.

Figure 3E:
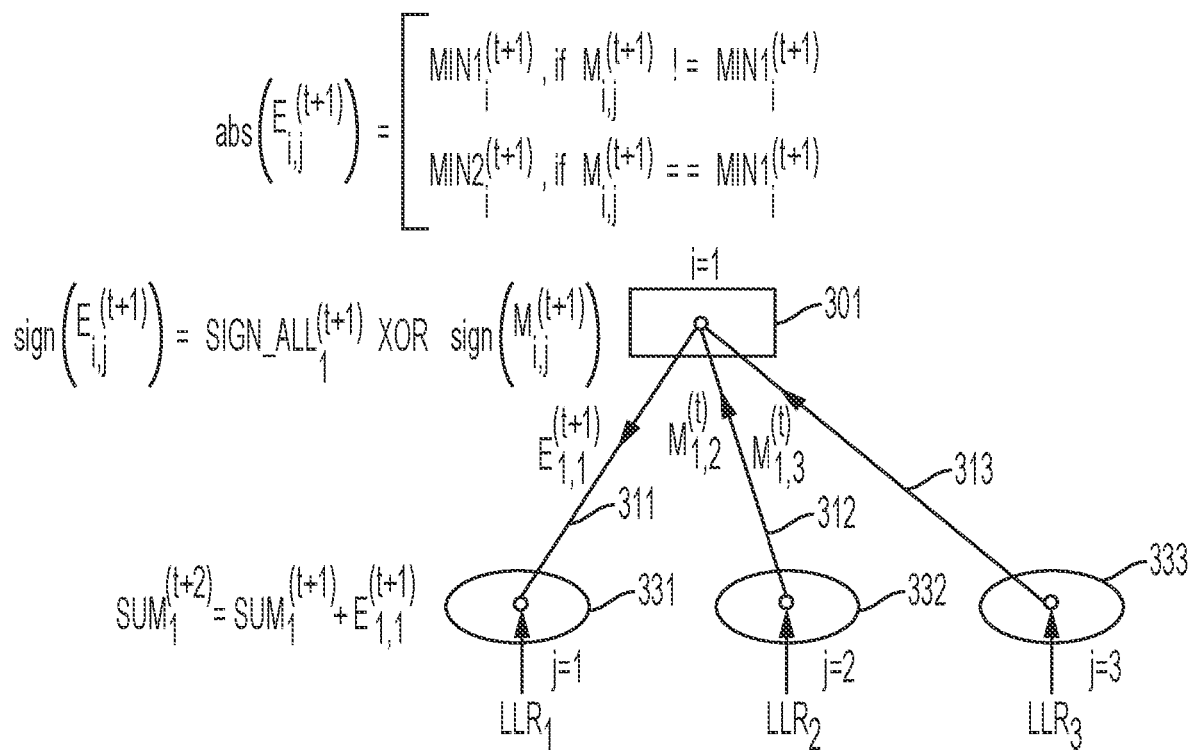
FIGS. 3E and 3F show sum stage operation with respect to a QC-LDPC decoder utilizing the min-sum algorithm, showing check node to variable node (C2V) operation of a QC-LDPC decoder.

A sum stage is utilized in the C2V operation of the LDPC decoder of this example when passing the message from the CNs to the VNs, as shown in FIG. 3E. As shown in the illustrated embodiment, logic of the LDPC decoder (e.g., using comparator logic) may determine a magnitude with respect to the messages passed from a CN to the connected VNs as follows:

$$\text{abs}(E_{i,j}^{(t+1)}) = \begin{bmatrix} MIN1_i^{(t+1)}, \text{ if } M_{i,j}^{(t+1)} \mathrel{!=} MIN1_i^{(t+1)} \\ MIN2_i^{(t+1)}, \text{ if } M_{i,j}^{(t+1)} == MIN1_i^{(t+1)} \end{bmatrix}$$

For example, the magnitude of message $E_{1,1}^{(t+1)}$ passed from CN 301 to VN 331 may be computed as Magnitude of $E_{1,1}^{(t+1)} = MIN1_1^{(t+1)}$ if $\text{abs}(M_{1,1}^{(t+1)}, \mathrel{!=} MIN1_{1,1}^{(t+1)}$, else Magnitude of $E_{1,1}^{(t+1)} = MIN2_1^{(t+1)})$. Logic of the LDPC decoder (e.g., using XOR gate logic) may further determine a sign for the messages passed from the CN to the connected VNs as follows:

$$\text{sign}(E_{i,j}^{(t+1)}) = \text{SIGN\_ALL}_i^{(t+1)} \text{XOR sign}(M_{i,j}^{(t+1)})$$

Figure 3F:
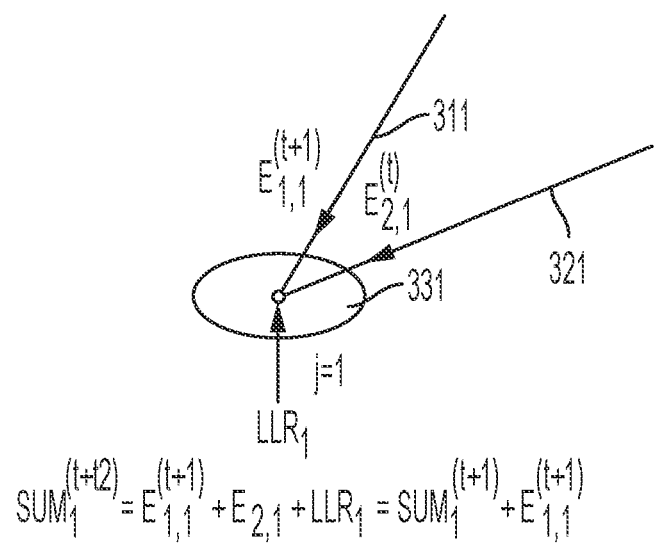

For example, the sign of message $E_{1,1}^{(t+1)}$ passed from CN 301 to VN 331 may be computed as Sign of $E_{1,1}^{(t+1)} = \text{SIGN\_ALL}_1^{(t+1)}$ XOR sign($M_{i,j}^{(t+1)}$), wherein sign=1 means negative). The messages passed from the CN may be used by logic of the LDPC decoder (e.g., using arithmetic logic) in computing a message to be provided to the CN in a V2C operation in a subsequent iteration of the decoding. As shown in FIG. 3F, the message passed from CN 301 may, for example, be used to compute $SUM_1^{(t+2)} + E_{1,1}^{(t+1)} + E_{2,1}^{(t+1)} + LLR_1 = SUM_1^{(t+1)} - E_{1,1}^{(t+1)}$ for a subsequent message passed from VN 331 to CN 301. This computation may be stated more generally as follows:

$$SUM_j^{(t+1)} = LLR_j + \sum_{i=1}^{2} E_{i,j}^{(t+1)}$$

Computations similar to those set forth above may be made for each of the other connected VNs.

Multiple iterations (e.g., repeated processing in accordance with the Tanner graphs of FIG. 3B, wherein the iteration designators (t) shown for the messages are incremented in each iteration) of the forgoing min-sum algorithm may be performed by the LDPC decoder and the parity equations evaluated in each iteration evaluated. The message processing steps implemented by the QC-LDPC decoder in performing the foregoing sequential min-sum decoding procedure may be represented as the following message sequence (wherein the bolded steps implement min-stage calculation and the un-bolded steps implement sum-stage calculation):

$$M_{1,1}^{(1)} \to M_{1,2}^{(1)} \to M_{1,3}^{(1)} \to E_{1,1}^{(1)} \to E_{1,2}^{(1)} \to$$
$$E_{1,3}^{(1)} \to M_{2,1}^{(1)} \to M_{2,2}^{(1)} \to M_{2,3}^{(1)} \to M_{2,4}^{(1)} \to$$
$$E_{2,1}^{(1)} \to E_{2,2}^{(1)} \to E_{2,3}^{(1)} \to E_{2,4}^{(1)} \to M_{1,1}^{(1)} \to \ldots$$

This iterative processing may be ended, and a valid codeword of the code block being decoded is indicated, when all the parity equations are satisfied.

BG matrix 390 of the foregoing example may be represented more generally by matrix entries $B_{ij}$, as follows:

$$BG = \begin{pmatrix} 1 & 0 & 1 & -1 \\ 0 & 2 & 0 & 1 \end{pmatrix} = \begin{pmatrix} B_{1,1} & B_{1,2} & B_{1,3} & B_{1,4} \\ B_{2,1} & B_{2,2} & B_{2,3} & B_{2,4} \end{pmatrix}$$

Using the above general BG matrix representation, the sequential min-sum decoding procedure may be represented, considering only the connection edge, as follows (wherein the bolded steps implement min-stage calculation and the un-bolded steps implement sum-stage calculation):

$$B_{1,1} \to B_{1,2} \to B_{1,3} \to B_{1,1} \to B_{1,2} \to B_{1,3} \to B_{2,1} \to B_{2,2} \to$$
$$B_{2,3} \to B_{2,4} \to B_{2,1} \to B_{2,2} * B_{2,3} \to B_{2,4} \to B_{1,1} \to \ldots$$

Figure 4:
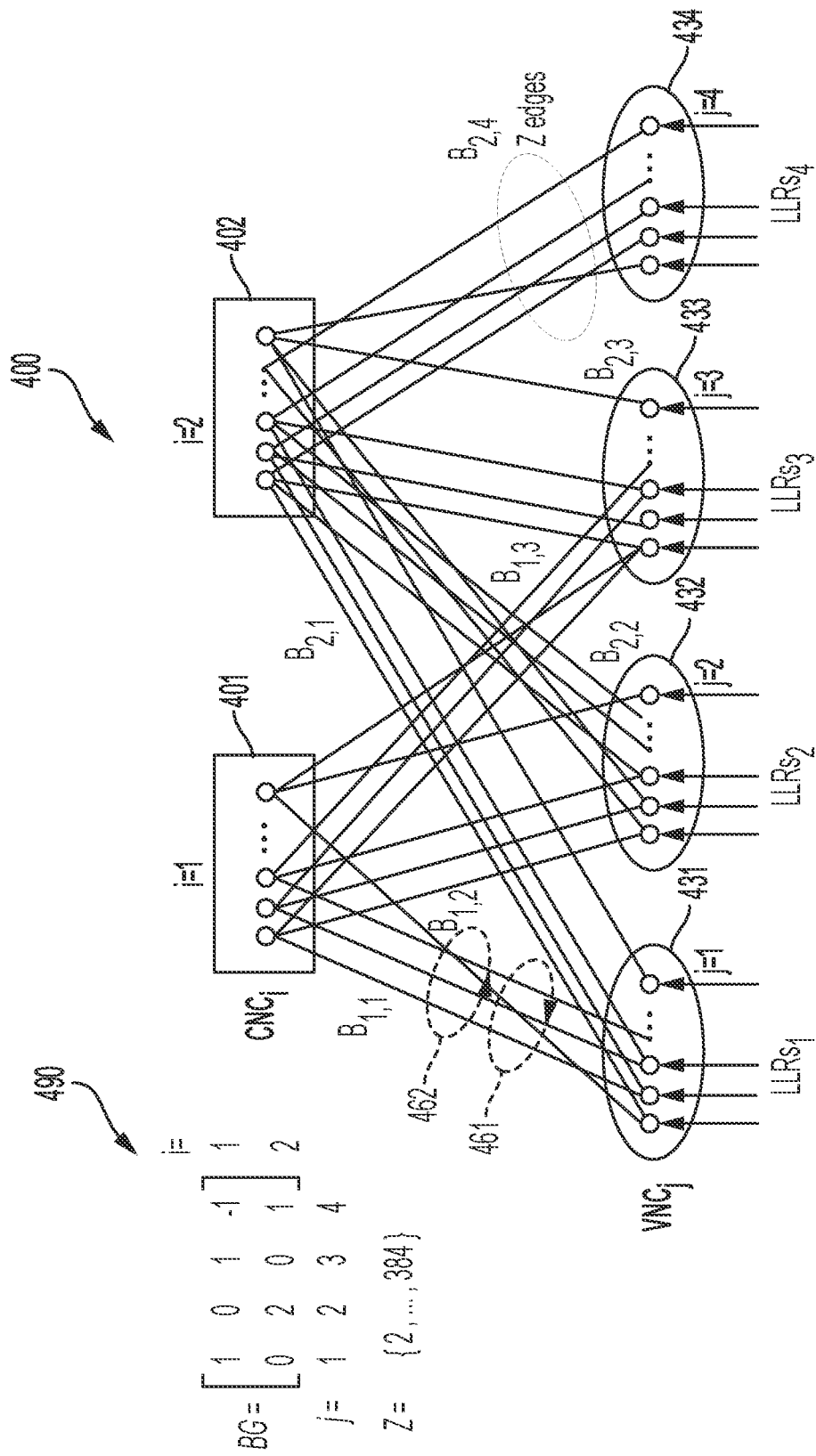
FIG. 4 shows BG matrix and a Tanner graph constructions for examples of QC-LDPC decoders implementing higher order lifting parameters.

The above example shows a simplified QC-LDPC decoding process where the lifting parameter Z=1. Higher order lifting parameters (also referred lifting value, lifting size, or expansion factor) may be utilized with respect to QC-LDPC codes to improve the decoding reliability. FIG. 4 shows BG matrix 490 and corresponding Tanner graph 400 for an example implementing a higher order lifting parameter (e.g., Z>1, such as Z={2, . . . , 384} for a 5G network implementation). In the example of FIG. 4, Tanner graph 400 represents the same LDPC code as matrix of BG matrix 490, wherein the BG matrix is represented according to the following:

$$BG = \begin{pmatrix} 1 & 0 & 1 & -1 \\ 0 & 2 & 0 & 1 \end{pmatrix} = \begin{pmatrix} B_{1,1} & B_{1,2} & B_{1,3} & B_{1,4} \\ B_{2,1} & B_{2,2} & B_{2,3} & B_{2,4} \end{pmatrix}$$

Like Tanner graph 300 discussed above, Tanner graph 400 of FIG. 4 includes two different sets of nodes (CNs and VNs). Implementation of the higher order lifting parameter provides for node clusters comprising a number of nodes corresponding to the lifting parameter value implemented (e.g., check node clusters (CNCs) 401 and 402 comprise clusters of Z CNs each and variable node clusters (VNCs) 431-434 comprise clusters of Z VNs each). As in the example above, the edges only connect nodes of the different node sets. Each entry of the BG matrix, however, is expanded by [Z×Z] identity matrix. Accordingly, as can be seen in the illustration of FIG. 4, each bundle of edges (e.g., $B_{1,1}$, $B_{1,2}$, $B_{1,3}$, $B_{1,4}$, $B_{2,1}$, $B_{2,2}$, $B_{2,3}$, and $B_{2,4}$) connecting the VNCs with the CNCs includes a number of edges corresponding to the lifting parameter being implemented (Z, where Z={2, . . . , 384} for a 5G network implementation). That is, where edges connect the CNCs to respective ones of the VNCs of Tanner graph 400 there are Z edges, and correspondingly each input of VNCs 431-434 includes Z number of LLRs.

In operation of QC-LDPC decoding according to Tanner graph 400, there are Z number of messages passed between the CNCs and connected ones of the VNCs, wherein a predefined cyclic shift. For example, a cyclic shift (represented for edge bundle $B_{1,1}$ by cyclic shift ring 461) may be implemented by a shifter (not shown in the illustration of FIG. 4) provided with respect to V2C messages and an anti-cyclic shift (represented for edge bundle $B_{1,1}$ by anti-cyclic shift ring 462) is provided with respect to the messages of the bundle groups when passing messages between the CNs and VNs. The value of elements of the BG matrix represent the cyclic shift value utilized in the LDPC decoding process (negative values of BG indicate no connection and thus no cyclic shift). Accordingly, the cyclic and anti-cyclic shifts provided in the example of FIG. 4 have values in accordance with the non-negative values of BG matrix 490. That is operation according to the illustrated example provides a cyclic shift of 1 when passing messages from VNC 431 to CNC 401 and an anti-cyclic shift of 1 when passing messages from CNC 401 to VNC 431, a cyclic shift of 0 when passing messages from VNC 432 to CNC 401 and an anti-cyclic shift of 0 when passing messages from CNC 401 to VNC 432, a cyclic shift of 1 when passing messages from VNC 433 to CNC 401 and an anti-cyclic shift when passing messages from CNC 401 to VNC 433, a cyclic shift of 0 when passing messages from VNC 431 to CNC 402 and an anti-cyclic shift of 0 when passing messages from CNC 402 to VNC 431, a cyclic shift of 2 when passing messages from VNC 432 to CNC 402 and an anti-cyclic shift of 2 when passing messages from CNC 402 to VNC 432, a cyclic shift of 0 when passing messages from VNC 433 to CNC 402 and an anti-cyclic shift of 0 when passing messages from CNC 402 to VNC 433, and a cyclic shift of 1 when passing messages from VNC 434 to CNC 402 and an anti-cyclic shift of 1 when passing messages from CNC 402 to VNC 434.

As discussed with respect to Tanner graph 300, traditional LDPC decoding operation in accordance with Tanner graph 400 sequentially passes messages from VNC to CNC (V2C), then from CNC to VNC (C2V), one CNC by one CNC. However, as the messages are passed between the CNCs and VNCs, cyclic shifting is provided in accordance with the values of corresponding elements of the BG matrix. Algorithms, such as the aforementioned min-sum algorithm, sum-product algorithm, belief propagation algorithm, and message passing algorithm, may be utilized by logic of the LDPC decoder with respect to the appropriately shifted messages to decode the LDPC codes.

FIGS. 5A-5C show slice views for respective Tanner graph constructions of example LDPC codes to aid in understating operation of QC-LDPC decoders, wherein FIG. 5A shows an example for lifting parameter Z=1, FIG. 5B shows an example for lifting parameter Z=3, and FIG. 3C shows an example for lifting parameter Z=384 (e.g., $Z=Z_{max}$ in a 5G network implementation). As shown in the example of FIG. 5A, a Tanner graph construction for an example of a LDPC code corresponding to that of Tanner graph 300 of FIG. 3A may be implemented in 1 slice (i.e., the number of slices corresponding to lifting parameter Z=1), wherein no data cyclic/anti-cyclic shift is provided when messages pass between CNs and VNs. However, as shown in FIG. 5B, a Tanner graph construction for an example of LDPC code corresponding an instance of that of Tanner graph 400 of FIG. 4 with lifting parameter Z=3 may be implemented in 3 slices (i.e., the number of slices corresponding to lifting parameter Z=3), wherein data is cyclically/anti-cyclically shifted among the different slices when messages pass between CNCs and VNCs using shifter 540. Similarly, as shown in FIG. 5C a Tanner graph construction for an example of LDPC code corresponding to another instance of that of Tanner graph 400 of FIG. 4 with lifting parameter Z=384 may be implemented in 384 slices (i.e., the number of slices corresponding to lifting parameter Z=384), wherein data is cyclically/anti-cyclically shifted among the different slices when messages pass between CNCs and VNCs using shifter 540.

Figure 6:
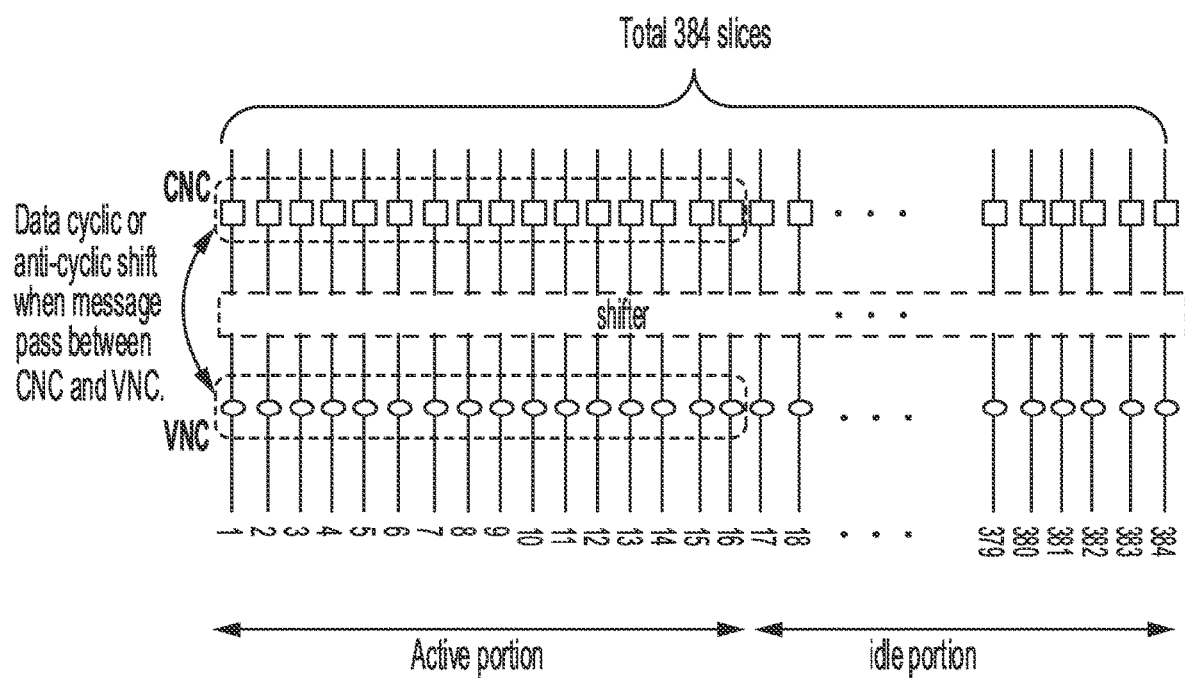
FIG. 6 shows a slice view of a QC-LDPC decoder configuration.

Traditional LDPC decoders can only decode one code block of any size at a time. Referring to the lifting parameter Z=384 example of FIG. 5C for instance, the hardware of the LDPC decoder is configured to accommodate Z=384 (i.e., provides a 384 slice implementation). If, however, the lifting parameter is small (e.g., lifting parameter Z=16) only a small portion of the slices will be activated, with the other slices idle, throughout the iterations of the LDPC decoding operation. This is illustrated in FIG. 6, wherein for the case of lifting parameter Z=16 slices 1-16 comprise the active slice and slices 17-384 remain idle throughout decoding the code block in operation according to a traditional LDPC decoder.

Figure 7:
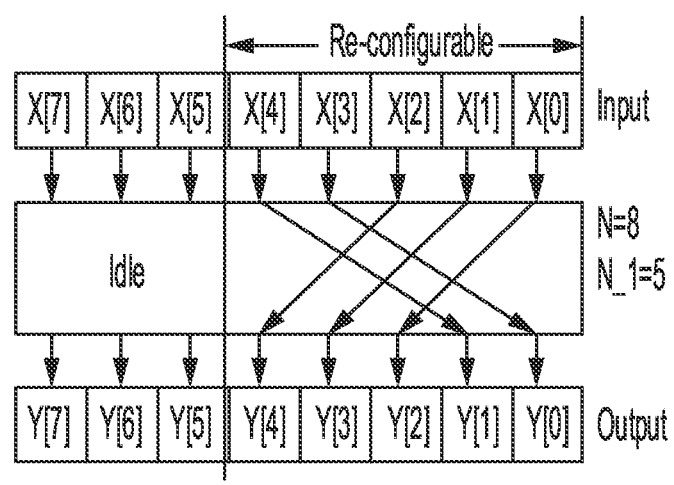
FIG. 7 shows scalable operation of a typical reconfigurable shifter implementation of a QC-LDPC decoder.

A reconfigurable scalable shifter configuration as traditionally implemented to accommodate data shifting with respect to data of different bit sizes for LDPC decoders, such as single codeword QC-LDPC decoder 200a of FIG. 2A, is shown in FIG. 7. In particular, FIG. 7 illustrates scalable operation of a typical reconfigurable shifter implementation for an example in which the shifter accommodates up to eight-bit data shifting and an instance of data shifting involves five-bit data (e.g., Z=5, $Z_{max}$=8). Logic circuitry of such traditional reconfigurable scalable shifters is designed based on the longest bit length of input data that the shifter can handle. In operation, portions of the logic circuitry are idle when processing input data with shorter bit lengths. For example, as shown in FIG. 7, although the shifter is reconfigurable to accommodate data shifting with respect to less than the full complement of data bits supported by the shifter, that portion of the shifter not needed for data shifting with respect to the scaled-down input remains idle during the particular instance of data shifting (e.g., circuitry with respect to data bit positions [7:5] remain idle while circuitry with respect to data bit positions [4:0] perform shifting with respect to 5-bit input data).

A more recent configuration of data shifter, as shown in U.S. Pat. No. 10,877,729 (the disclosure of which is incorporated herein by reference), provides a reconfigurable segmented scalable shifter supporting data shifting of differing bit lengths in parallel. For example, messages of differing bit lengths may be provided individual data shifting in parallel. An example of such a reconfigurable segmented scalable shifter, such as may be utilized in parallel codeword QC-LDPC decoder 200b of FIG. 2B, is shown as reconfigurable segmented scalable shifter 840 of FIG. 8.

Figure 8:
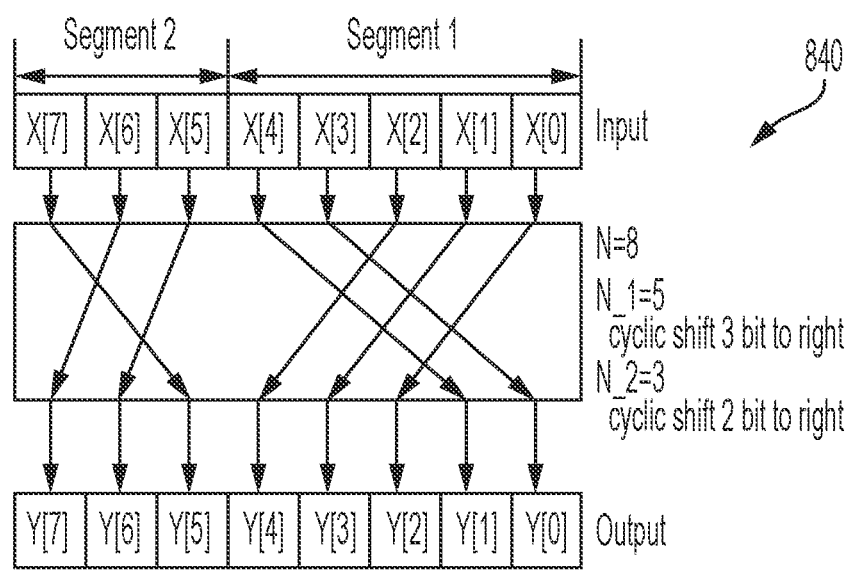
FIGS. 8 and 9 show examples of reconfigurable segmented scalable shifters as may be utilized according to embodiments of the invention for partitioning into multiple segments of different sizes to perform cyclic shifts of different shift values in parallel.

Reconfigurable segmented scalable shifter 840 of the example of FIG. 8 is implemented in a 2 segment (M=2) configuration. In particular, FIG. 8 shows reconfigurable segmented scalable shifter 840 configured as an 8 bit 2 segment implementation wherein segment 1 provides a 3 bit cyclic shift to the right and segment 2 provides a 2 bit cyclic shift to the right (e.g., shifter size N=8, number of segments M=2, segment 1 size N_1=5, segment 1 shift value S_1=3, segment 1 shift direction D_1=Right, and segment 1 shift type T_1=Cyclic, segment 2 size N_2=3, segment 2 shift value S_2=2, segment 2 shift direction D_2=Right, and segment 2 shift type T_2=Cyclic). The input data (X) of the example of FIG. 8 comprises 8 bits, wherein the input data may be represented as X[7:0] (e.g., X[7:0]={X[7], X[6], X[5], X[4], X[3], X[2], X[1], X[0]}) and the output data may be represented as Y[7:0] (e.g., Y[7:0]={Y[7], Y[6], Y[5], Y[4], Y[3], Y[2], Y[1], Y[0]}). In the example of FIG. 8, the number of segments (M) is 2, wherein segment 1 comprises 5 bits and segment 2 comprises 3 bits such that X_1[4:0] is the input of segment 1 and X_2[2:0] is the input of segment 2, and Y_1[4:0] is the output data of segment 1 and Y_2[2:0] is the output data of segment 2. Accordingly, X[7:0]={X[7], X[6], X[5], X[4], X[3], X[2], X[1], X[0]}={X_2[2:0], X_1[4:0]}, wherein X_1[4:0]={X[4], X[3], X[2], X[1], X[0]} and X_2[2:0]={X[7], X[6], X[5]}. Similarly, Y[7:0]={Y[7], Y[6], Y[5], Y[4], Y[3], Y[2], Y[1], Y[0]}={Y_2[2:0], Y_1[4:0]}, wherein Y_1[4:0]={Y[4], Y[3], Y[2], Y[1], Y[0]}, and Y_2[2:0]={Y[7], Y[6], Y[5]}.

Figure 9:
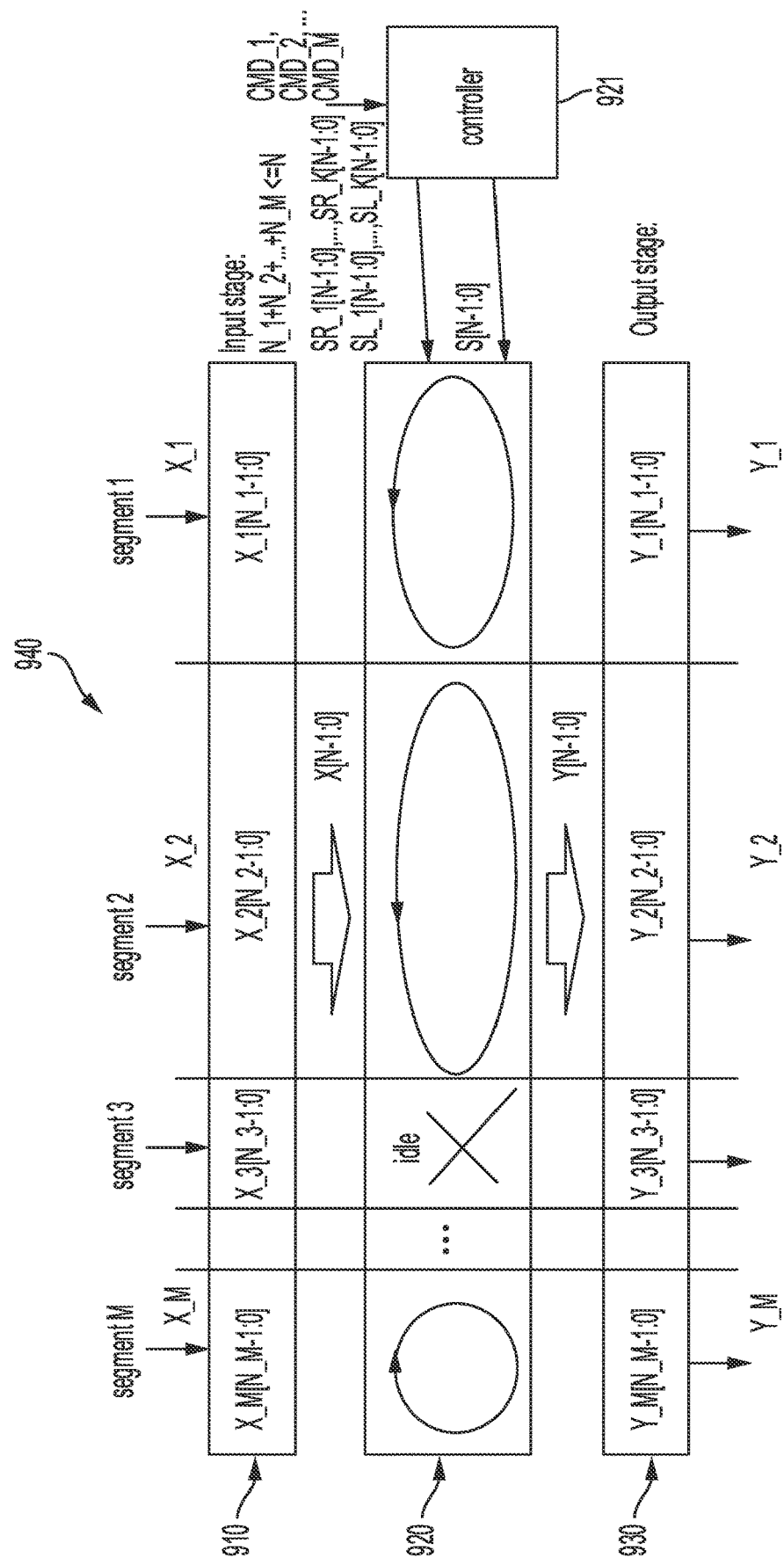

FIG. 9 shows further detail with respect to a reconfigurable segmented scalable shifter configuration as may be utilized according to embodiments of the invention for partitioning into multiple segments of different sizes to perform cyclic shifts of different shift values in parallel. In particular, reconfigurable segmented scalable shifter 940 shown in FIG. 9 includes input stage 910, shifter stage 920, and output stage 930 implementing a segmentation configuration.

Input stage 910 may comprise configurable memory elements (e.g., random access memory (RAM), flash memory, magnetic memory, optical memory, etc.) and/or controllable data paths (e.g., controllable data path elements) suitable for storage of the data of messages input to reconfigurable segmented scalable shifter 940 for which shifting is provided and for controllably associating such data with reconfigurable segments of shifter stage 920.

Input stage 910 may be utilized to associate the one or more messages (e.g., X_1, X_2, . . . X_M) of the input data (X) with corresponding segments of shifter stage 920. For example, in the illustrated example, the input data (X) includes messages X_1, X_2, X_3, . . . X_M, wherein input stage 910 facilitates correspondence of the N_1 number of bits of message X_1 (e.g., bits 0 to N_1-1 of message X_1) to segment 1 of shifter stage 920, correspondence of the N_2 number of bits of message X_2 (e.g., bits 0 to N_2-1 of message X_2) to segment 2 of shifter stage 920, correspondence of the N_3 number of bits of message X_3 (e.g., bits 0 to N_3-1 of message X_3) to segment 3 of shifter stage 920, and correspondence of the N_M number of bits of message X_M (e.g., bits 0 to N_M-1 of message X_M) to segment M of shifter stage 920.

Shifter stage 920 may comprise controllable data path elements (e.g., multiplexers and associated control elements) suitable for implementing data shifts. Such data path elements of embodiments may implement various shifter architectures, such as logarithmic shifter configurations, barrel shifter configurations, combinational shifter configurations, etc. Shifter stage 920 provides reconfigurable, scalable segments that may be utilized in implementing data shifting in parallel with respect to multiple messages of input data. Controller 921 of shifter stage 920 is shown in the illustrated embodiment for providing shifting commands to the segments of shifter stage 920 in accordance with data shift commands (e.g., CMD_1, CMD_2, . . . CMD_M) provided in association with the input data (e.g., X=X_1, X_2, X_3, . . . X_M). Data shifting is independently provided by segments (e.g., left cyclic by segment 1, left cyclic by segment 2, and right cyclic by segment M) of shifter stage 920 in accordance with the respective data shift commands to thereby implement multiple individual different data shifts at a time in parallel.

It should be appreciated that, although implementation of cyclic shifts are illustrated in the example of FIG. 9, one or more segments may be configured so as to provide no data shifting operation in any instance of data shifting by reconfigurable segmented scalable shifter 940. For example, segment 3 shown in the exemplary embodiment of FIG. 9 is unused for data shifting (e.g., idle or configured to pass data bits straight through without shifting) in the data shifting instance illustrated. The location of such unused segments may be anywhere within the reconfigurable segmented scalable shifter of embodiments, such as to conveniently accommodate various message lengths, to facilitate a segment starting with the least significant bit (LSB) of a respective message, etc.

Reconfigurable segmented scalable shifter 940 is configured to be reconfigurable with respect to data width and/or shift command of each message of input data. For example, shifter stage 920 is reconfigurable with respect to the number of segments (M) (e.g., $1 \leq M \leq N$), the size of each segment (N_m) (e.g., $N \geq N\_m \geq 2$), the shift value (S) of each segment (S_m) ($0 \leq S\_m \leq N$), the shift direction (D) of each segment (D_m) (e.g., D_m is left or right), and/or the shift type (T) of each segment (T_m) (e.g., T_m is logical, arithmetic, or cyclic), any or all of which may be controlled by controller 921. The individual data shift commands (e.g., CMD_1, CMD_2, . . . CMD_M) provided to reconfigurable segmented scalable shifter 940 (e.g., to controller 921) of embodiments may include various such information (e.g., the size of the respective segment (N_m), the shift value of the respective segment (S_m), the shift direction of the respective segment (D_m), the shift type of the respective segment (T_m), etc.). Additionally or alternatively, one or more general data shift commands (e.g., CMD, not shown in the illustrated embodiment) including various such information (e.g., the number of segments (M), the size of each segment (N_m), a globally applicable shift value (S), a globally applicable shift direction (D), a globally applicable shift type (T), etc.) may be provided to reconfigurable segmented scalable shifter 940 (e.g., to controller 921) of embodiments for controlling aspects generally applicable to the shifter and/or segments thereof.

Output stage 930 may comprise configurable memory elements (e.g., RAM, flash memory, magnetic memory, optical memory, etc.) and/or controllable data paths (e.g., controllable data path elements) suitable for controllably associating reconfigurable segments of shifter stage 920 with messages of output data for storage of the shifted data of the messages for which shifting is provided. Output stage 930 may be utilized to associate segments of shifter stage 920 with the one or more messages (e.g., Y_1, Y_2, . . . Y_M) of the output data (Y). For example, in the illustrated example, the output data (Y) includes messages Y_1, Y_2, Y_3, . . . Y_M, wherein output stage 910 facilitates correspondence of the N_1 number of the shifted bits of message Y_1 (e.g., bits 0 to N_1-1 of message Y_1) to segment 1 of shifter stage 920, correspondence of the N_2 number of shifted bits of message Y_2 (e.g., bits 0 to N_2-1 of message Y_2) to segment 2 of shifter stage 420, correspondence of the N_3 number of un-shifted bits of message Y_3 (e.g., bits 0 to N_3-1 of message Y_3) to segment 3 (idle in this illustrated example) of shifter stage 920, and correspondence of the N_M number of shifted bits of message Y_M (e.g., bits 0 to N_M-1 of message Y_M) to segment M of shifter stage 20.

Figure 10:
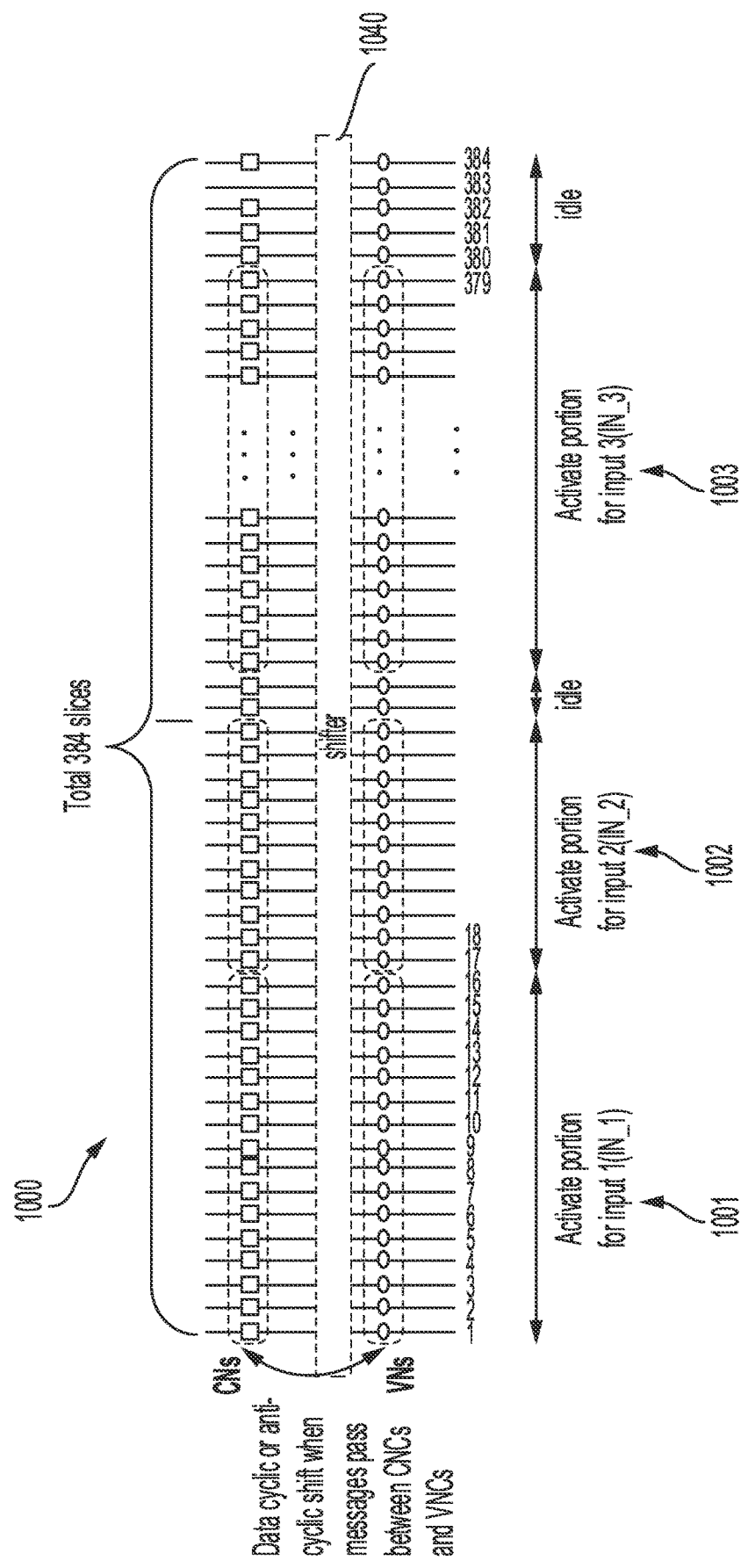
FIG. 10 shows a slice view of a QC-LDPC decoder configuration utilizing a reconfigurable segmented scalable shifter configuration implementing parallel codeword decoding.

Use of a reconfigurable segmented scalable shifter (e.g., configurations of reconfigurable segmented scalable shifter 840 of FIG. 8 and reconfigurable segmented scalable shifter 940 of FIG. 9) in a parallel codeword QC-LDPC decoder (e.g., parallel codeword QC-LDPC decoder 200b of FIG. 2B) implementation is shown in FIG. 10. In particular, FIG. 10 shows a slice view of a parallel codeword QC-LDPC decoder configuration utilizing a reconfigurable segmented scalable shifter configuration for decoding multiple code blocks in parallel. In the example of FIG. 10, parallel codeword QC-LDPC decoder 1000 provides parallel processing of a plurality of code blocks having a total combined lifting parameter size (e.g., ZIN_1+ZIN_2+ ... ZIN_M) that is less than or equal to Z (i.e., 384 in this example) using reconfigurable segmented scalable shifter 1040. Reconfigurable segmented scalable shifter 1040 of the illustrated example is configured to provide active portions 1001-1003 configured for parallel processing of code blocks from a plurality of input signals, shown as IN_1, IN_2, and IN_3 (e.g., as may correspond to signals from a plurality of connected terminals served by a base station hosting a receiver utilizing the parallel codeword QC-LDPC decoder, etc.).

In operation, each active region of parallel codeword QC-LDPC shifter 1000 processes a respective code block (e.g., active portion 1001 processes a code block of IN_1, active portion 1002 processes a code block of IN_2, and active portion 1003 processes a code block of IN_3) in parallel. For example, a code block of IN_1 having lifting parameter Z=16 may be provided to slices 1 through 16 of parallel LDPC decoder 1000 for providing appropriate data cyclic and anti-cyclic shifting when messages pass between CNCs and VNCs. Since lifting parameter Z=16 is less than the total lifting parameter Z=384 accommodated by parallel codeword QC-LDPC decoder 1000, other code blocks are provided decoding operation using portions of parallel codeword QC-LDPC decoder 1000 that are unused by decoding operation of the code block of IN_1. In the illustrated example, a code block of IN_2 having lifting parameter Z=(X−17+1) is provided to slices 17 through X of parallel codeword QC-LDPC decoder 1000 for providing appropriate data cyclic and anti-cyclic shifting when messages pass between CNCs and VNCs. Similarly, a code block of IN_3 having lifting parameter Z=(379−Y+1) is provided to slices Y through 379 of parallel codeword QC-LDPC decoder 1000 for providing appropriate data cyclic and anti-cyclic shifting when messages pass between CNCs and VNCs.

The code block inputs of each active portion of parallel codeword QC-LDPC decoder 1000 go through the same series of message processing steps implemented by the QC-LDPC decoder. That is, in the illustrated example wherein code blocks are provided at inputs IN_1, IN_2, and IN_3 of parallel codeword QC-LDPC decoder 1000, the three code blocks are each processed according to the same decoding procedure comprising a plurality of serially performed decoding processing steps. For example, when performing a min-sum decoding procedure, a codeword at input IN_1 (codeword$_1$) would undergo a series of decoding processing steps as follows (wherein the bolded steps implement min-stage calculation and the un-bolded steps implement sum-stage calculation):

$$M1_{1,1}^{(1)} \rightarrow M1_{1,2}^{(1)} \rightarrow M1_{1,3}^{(1)} \rightarrow E1_{1,1}^{(1)} \rightarrow$$
$$E1_{1,2}^{(1)} \rightarrow E1_{1,3}^{(1)} \rightarrow M1_{2,1}^{(1)} \rightarrow M1_{2,2}^{(1)} \rightarrow$$
$$M1_{2,3}^{(1)} \rightarrow M1_{2,4}^{(1)} \rightarrow E1_{2,1}^{(1)} \rightarrow E1_{2,2}^{(1)} \rightarrow$$
$$E1_{2,3}^{(1)} \rightarrow E1_{2,4}^{(1)} \rightarrow M1_{1,1}^{(2)} \rightarrow \ldots$$

wherein the iterative processing for codeword$_1$ is ended when all the parity equations are satisfied. Similarly, a codeword at input IN_2 (codeword$_2$) would undergo a series of decoding processing steps as follows:

$$M2_{1,1}^{(1)} \rightarrow M2_{1,2}^{(1)} \rightarrow M2_{1,3}^{(1)} \rightarrow E2_{1,1}^{(1)} \rightarrow$$
$$E2_{1,2}^{(1)} \rightarrow E2_{1,3}^{(1)} \rightarrow M2_{2,1}^{(1)} \rightarrow M2_{2,2}^{(1)} \rightarrow$$
$$M2_{2,3}^{(1)} \rightarrow M2_{2,4}^{(1)} \rightarrow E2_{2,1}^{(1)} \rightarrow E2_{2,2}^{(1)} \rightarrow$$
$$E2_{2,3}^{(1)} \rightarrow E2_{2,4}^{(1)} \rightarrow M2_{1,1}^{(2)} \rightarrow \ldots$$

wherein the iterative processing for codeword$_2$ is ended when all the parity equations are satisfied. Likewise, a codeword at input IN_3 (codeword$_3$) would undergo a series of decoding processing steps as follows:

$$M3_{1,1}^{(1)} \rightarrow M3_{1,2}^{(1)} \rightarrow M3_{1,3}^{(1)} \rightarrow E3_{1,1}^{(1)} \rightarrow E3_{1,2}^{(1)}$$
$$\rightarrow E3_{1,3}^{(1)} \rightarrow M3_{2,1}^{(1)} \rightarrow M3_{2,2}^{(1)} \rightarrow M3_{2,3}^{(1)} \rightarrow M3_{2,4}^{(1)} \rightarrow E3_{2,1}^{(1)} \rightarrow E3_{2,2}^{(1)} \rightarrow E3_{2,3}^{(1)} \rightarrow E3_{2,4}^{(1)}$$
$$\rightarrow M3_{1,1}^{(2)} \rightarrow \ldots$$

wherein the iterative processing for codeword$_3$ is ended when all the parity equations are satisfied.

It can be appreciated from the foregoing that, although the three code block inputs of the example are decoded simultaneously by three segments of the parallel codeword QC-LDPC decoder, appreciable latencies may nevertheless be experienced in the decoding process of each codeword as a result of the plurality of message processing steps implemented by the parallel codeword QC-LDPC decoder. In contrast, low-latency segmented QC-LDPC decoders of embodiments of the invention implement a QC-LDPC decoder configured to be divided into multiple segments and to process multiple bundles of edges for a codeword simultaneously to speed up the decoding process of the codeword. A low-latency segmented QC-LDPC decoder of some embodiments may, for example, be utilized in facilitating low latency communications with respect to vehicle-to-everything (V2X) communications requiring low-latency and reliable communication services.

Figure 11:
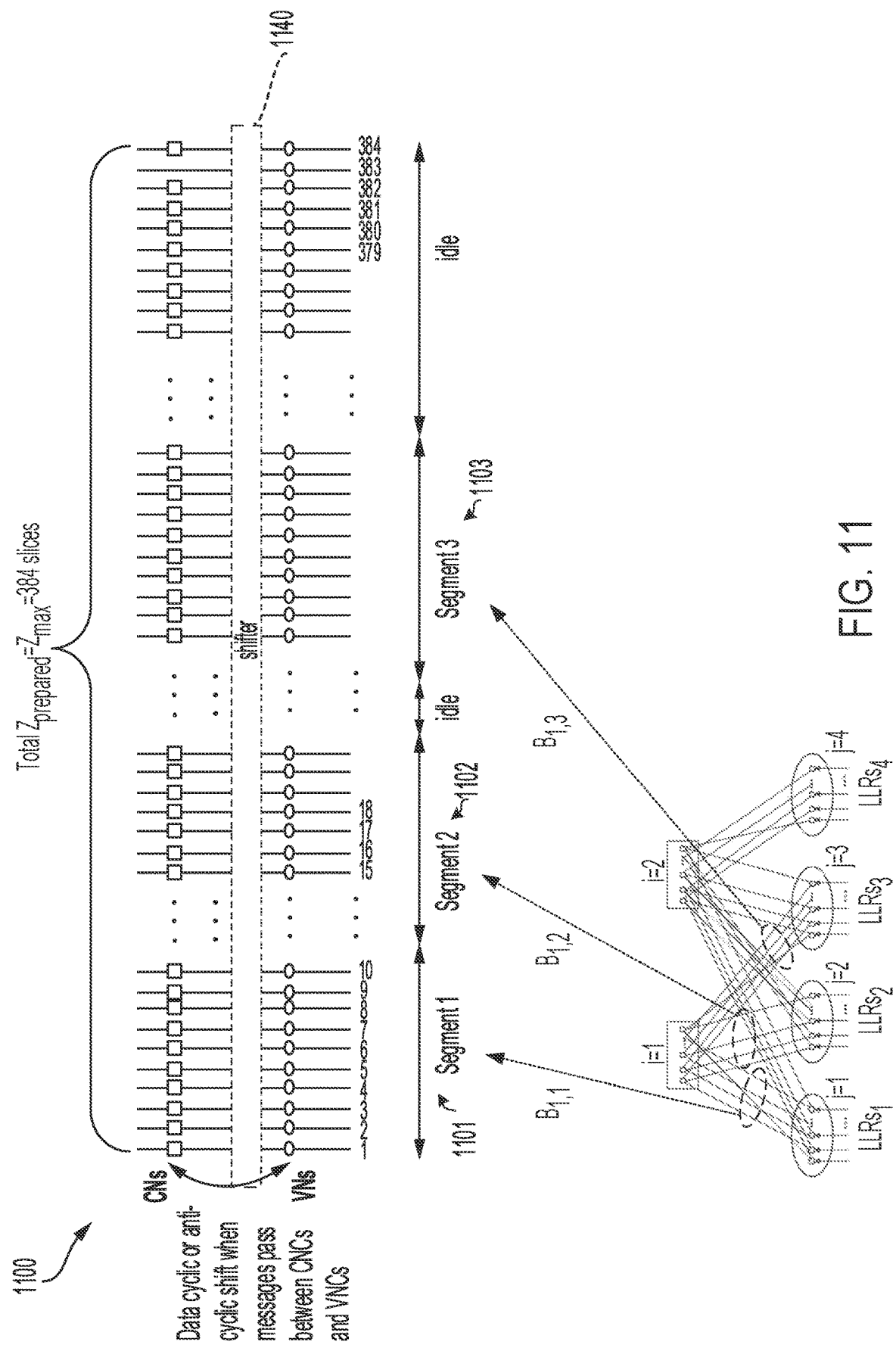
FIGS. 11, 12, and 13 show slice views of low-latency segmented QC-LDPC decoder configurations utilizing a reconfigurable segmented scalable shifter configuration implementing multi-segment codeword parallel edge bundle processing according to embodiments of the invention.

FIG. 11 shows a slice view of low-latency segmented QC-LDPC decoder 1100 implementing reconfigurable segmented scalable shifter 1140 for parallel processing of multiple bundles of edges connecting a CNC and corresponding VNCs for a codeword. In the illustrated example, low-latency segmented QC-LDPC decoder 1100 provides a multi-segment codeword parallel edge bundle processing configuration, such as may be utilized to speed up the decoding process by implementing parallel processing of bundles of messages of a codeword being decoded. For example, the multi-segment codeword parallel edge bundle processing configuration of FIG. 11 facilitates simultaneous processing with respect to edge bundle $B_{1,1}$ connecting $CNC_1$ and $VNC_1$, edge bundle $B_{1,2}$ connecting $CNC_1$ and $VNC_2$, and edge bundle $B_{1,3}$ connecting $CNC_1$ and $VNC_3$ (e.g., corresponding to the above example BG matrix and corresponding Tanner graph of FIG. 4 wherein the negative entry in BG matrix position i=1, j=4 corresponds to no connection or edge between $CNC_1$ and $VNC_y$ in the Tanner graph). That is, Segment1 (e.g., active portion 1101) of low-latency segmented QC-LDPC decoder 1100 provides decode processing with respect to the messages of edge bundle $B_{1,1}$ connecting $CNC_1$ and $VNC_1$, Segment2 (e.g., active portion 1102) provides decode processing with respect to messages of edge bundle $B_{1,2}$ connecting $CNC_1$ and $VNC_2$, and Segment3 (e.g., active portion 1103) provides decode processing with respect to messages edge bundle $B_{1,3}$ connecting $CNC_1$ and $VNC_3$, wherein each of Segment1, Segment2, and Segment 3 are of size Z (i.e., comprising Z edges). Reconfigurable segmented scalable shifter 1140 of embodiments thus comprises a shifter configured for dividing into multiple segments supporting simultaneous processing of decoding tasks for a codeword undergoing decoding processing. In accordance with some embodiments, reconfigurable segmented scalable shifter 1140 may comprise an instance of reconfigurable segmented scalable shifter 940 of FIG. 9 configured to process multiple bundles of edges of a codeword simultaneously.

In accordance with embodiments of the invention, decode processing tasks for a codeword are partitioned and allocated to different segments of a low-latency segmented QC-LDPC decoder such that the low-latency segmented QC-LDPC decoder processes multiple bundles of messages (or edges) in parallel. Parallel processing of multiple bundles of edges for a codeword according to concepts herein is illustrated in the table below. In particular, the table below provides both the message processing steps implemented by a QC-LDPC decoder in performing the traditional sequential min-sum decoding procedure (e.g., the message sequence described above with respect to the example of FIG. 3B) and the message processing steps implemented by a low-latency segmented QC-LDPC decoder in performing the min-sum decoding procedure in which messages of multiple bundles of edges with respect to a same CNC are processed simultaneously (e.g., the three segment message sequences corresponding to the example of FIG. 11).

| | Traditional Processing | Parallel Processing of Multiple Message Bundles for a Codeword | | |
|---|---|---|---|---|
| Step | Sequential | Segment 1 | Segment2 | Segment3 |
| 1 | $M^{(1)}_{1,1}$ | $M^{(1)}_{1,1}$ | $M^{(1)}_{1,2}$ | $M^{(1)}_{1,3}$ |
| 2 | $M^{(1)}_{1,2}$ | $E^{(1)}_{1,1}$ | $E^{(1)}_{1,2}$ | $E^{(1)}_{1,3}$ |
| 3 | $M^{(1)}_{1,3}$ | $M^{(1)}_{2,1}$ | $M^{(1)}_{2,2}$ | $M^{(1)}_{2,3}$ |
| 4 | $E^{(1)}_{1,1}$ | $M^{(1)}_{2,4}$ | | |
| 5 | $E^{(1)}_{1,2}$ | $E^{(1)}_{2,1}$ | $E^{(1)}_{2,2}$ | $E^{(1)}_{2,3}$ |
| 6 | $E^{(1)}_{1,3}$ | $E^{(1)}_{2,4}$ | | |
| 7 | $M^{(1)}_{2,1}$ | | | |
| 8 | $M^{(1)}_{2,2}$ | | | |
| 9 | $M^{(1)}_{2,3}$ | | | |
| 10 | $M^{(1)}_{2,4}$ | | | |
| 11 | $E^{(1)}_{2,1}$ | | | |
| 12 | $E^{(1)}_{2,2}$ | | | |
| 13 | $E^{(1)}_{2,3}$ | | | |
| 14 | $E^{(1)}_{2,4}$ | | | |

The message processing steps in the table above represent a single iteration of decode message processing for the previously described example BG matrix $$\left( BG = \begin{pmatrix} 1 & 0 & 1 & -1 \\ 0 & 2 & 0 & 1 \end{pmatrix} \right),$$

wherein the steps provide processing with respect to the bundles of edges connecting $CNC_1$ and $VNC_1$ ($B_{1,1}$), $CNC_1$ and $VNC_2$ ($B_{1,2}$), $CNC_1$ and $VNC_3$ ($B_{1,3}$), $CNC_2$ and $VNC_1$ ($B_{2,1}$), $CNC_{1=2}$ and $VNC_2$ ($B_{2,2}$), $CNC_2$ and $VNC_3$ ($B_{2,3}$), and $CNC_2$ and $VNC_4$ ($B_{2,4}$). As with the various message flows described above, the bold message notations of the table above correspond to steps implementing min-stage calculation and the un-bolded notations correspond to steps implementing sum-stage calculation.

In the example of FIG. 11, the decode processing tasks for the codeword are partitioned and allocated to different segments of the low-latency segmented QC-LDPC decoder so that parallel processing of multiple message bundles with respect to a CNC for a codeword is provided, as shown by the exemplary message processing steps of the table above. The multi-segment (e.g., three segment) codeword parallel edge bundle processing of this example low-latency segmented QC-LDPC decoder configuration performs decode processing for the decode message processing iteration in six steps. In contrast, the sequential message processing of the traditional QC-LDPC decoder performs decode processing for the decode message processing iteration in fourteen steps. Accordingly, it can be seen that latencies experienced in the decoding process of each codeword can be appreciably reduced (e.g., on the order of 40% in the above example) by implementations of a low-latency segmented QC-LDPC decoder according to concepts of the present invention.

The decode processing tasks for the codeword of this example have been partitioned and allocated to different segments of the low-latency segmented QC-LDPC decoder so that the messages of multiple edge bundles with respect to a same CNC are processed in parallel. For example, in an implementation in which the low-latency segmented QC-LDPC decoder utilizes the min-sum algorithm, min-stage calculations for a plurality of message bundles are performed in parallel and sum-stage calculations for a plurality of message bundles are performed in parallel. The example parallel message bundle processing configuration provides operation in which the calculations that typically utilize results of other calculations (e.g., sum-stage calculations utilizing results of min-stage calculation) may nevertheless utilize those calculations. Although calculations are performed in parallel by the example low-latency segmented QC-LDPC decoder configuration, the results of the calculations for the various edge bundles equate to results of the corresponding calculations performed in the traditional sequential decoding procedure. That is, the results of the min-stage calculations and the sum-stage calculations in the message processing steps represented for the sequential message processing steps in the above table are the same as the results of the corresponding min-stage calculations and the corresponding sum-stage calculations in the message processing steps represented for the parallel message processing steps. Thus, low-latency segmented QC-LDPC decoder operation according to embodiments of the invention converges on a decoded codeword (i.e., all parity equations are satisfied) in the same number of decode processing iterations. However, as shown above, each decode processing iteration of the low-latency segmented QC-LDPC decoder implements fewer message processing steps than the traditional sequential message decoding process.

It should be appreciated that, although the exemplary low-latency segmented QC-LDPC decoder illustrated in FIG. 11 is shown as being divided into three segments, various numbers of segments may be implemented in accordance with the concepts herein (e.g., with or without idle portions between). For example, according to embodiments in which the decoding tasks for a single codeword are partitioned for simultaneous processing using a plurality of segments of a low-latency segmented QC-LDPC decoder, a total of M segments may be implemented, wherein M=floor [Zmax/Z], Zmax=maximum codeword size (e.g., 384 in the above 5G example), and Z=size of each segment. Accordingly, message bundles of two or more of edge bundles $B_{1,1}$, $B_{1,2}$, $B_{1,3}$, $B_{1,3}$, $B_{1,4}$, . . . may be processed in parallel, message bundles of two or more of edge bundles $B_{2,1}$, $B_{2,2}$, $B_{2,3}$, $B_{2,4}$, . . . may be processed in parallel, etc. by low-latency segmented QC-LDPC decoder 1100 of embodiments where the number of segments M utilized in the parallel processing is in accordance with the foregoing. Such segmented parallel processing may be particularly well suited to application with respect to relatively small input codewords (e.g., codewords associated with V2X communications), wherein the resources of a low-latency segmented QC-LDPC decoder are sufficient to support the partitioning and allocation of the tasks.

Further, although the example of parallel processing of multiple message bundles for a codeword above allocates decode processing tasks so that the messages of multiple edge bundles with respect to a same CNC are processed in parallel, it should be appreciated that other schemes for partitioning and allocating decode processing tasks for a codeword may be implemented according to concepts herein. For example, the decode processing tasks for a codeword may be partitioned and allocated to different segments of a low-latency segmented QC-LDPC decoder of some embodiments so that the messages of edge bundles with respect to a plurality of CNCs are processed in parallel. Accordingly, message bundles of one or more of edge bundles $B_{1,1}$, $B_{1,2}$, $B_{1,3}$, $B_{1,4}$, . . . may be processed in parallel with message bundles of one or more of edge bundles $B_{2,1}$, $B_{2,2}$, $B_{2,3}$, $B_{2,4}$, . . . , etc. where the number of segments M is in accordance with the foregoing.

Figure 12:
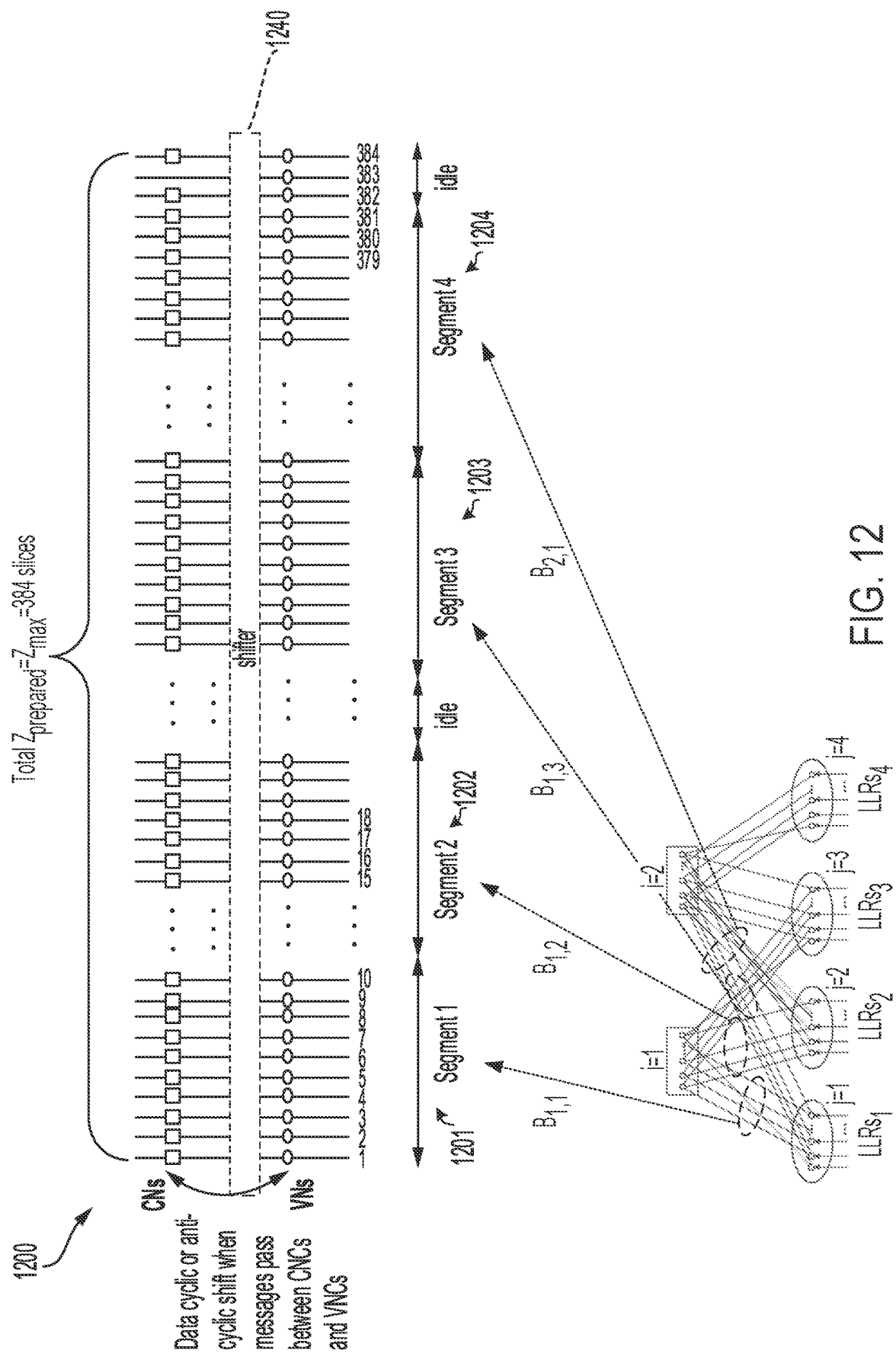

FIG. 12 shows a slice view of low-latency segmented QC-LDPC decoder 1200 implementing reconfigurable segmented scalable shifter 1240 for parallel processing of multiple bundles of edges connecting a plurality of CNCs and corresponding VNCs for a codeword. As with the example of FIG. 11 above, low-latency segmented QC-LDPC decoder 1200 provides a multi-segment codeword parallel edge bundle processing configuration, such as may be utilized to speed up the decoding process by implementing parallel processing of bundles of messages of a codeword being decoded. The multi-segment codeword parallel edge bundle processing configuration of FIG. 12 facilitates simultaneous processing with respect to edge bundle $B_{1,1}$ connecting $CNC_1$ and $VNC_1$, edge bundle $B_{1,2}$ connecting $CNC_1$ and $VNC_2$, edge bundle $B_{1,3}$ connecting $CNC_1$ and $VNC_3$, and edge bundle $B_{2,1}$ connecting $CNC_2$ and $VNC_1$ (e.g., corresponding to the above example BG matrix and corresponding Tanner graph of FIG. 4 wherein the negative entry in BG matrix position i=1, j=4 corresponds to no connection or edge between $CNC_1$ and $VNC_v$ in the Tanner graph). That is, Segment1 (e.g., active portion 1201) of low-latency segmented QC-LDPC decoder 1200 provides decode processing with respect to the messages of edge bundle $B_{1,1}$ connecting $CNC_1$ and $VNC_1$, Segment2 (e.g., active portion 1202) provides decode processing with respect to messages of edge bundle $B_{1,2}$ connecting $CNC_1$ and $VNC_2$, Segment3 (e.g., active portion 1203) provides decode processing with respect to messages edge bundle $B_{1,3}$ connecting $CNC_1$ and $VNC_3$, and Segment4 (e.g., active portion 1204) provides decode processing with respect to the messages of edge bundle $B_{2,1}$ connecting $CNC_2$ and $VNC_1$. Reconfigurable segmented scalable shifter 1240 of embodiments thus comprises a shifter configured for dividing into multiple segments supporting simultaneous processing of decoding tasks for a codeword undergoing decoding processing. In accordance with some embodiments, reconfigurable segmented scalable shifter 1240 may comprise an instance of reconfigurable segmented scalable shifter 940 of FIG. 9 configured to process multiple bundles of edges of a codeword simultaneously.

The table below provides both the message processing steps implemented by a QC-LDPC decoder in performing the traditional sequential min-sum decoding procedure (e.g., the message sequence described above with respect to the example of FIG. 3B) and the message processing steps implemented by a low-latency segmented QC-LDPC decoder in performing the min-sum decoding procedure in which messages of multiple bundles of edges with respect to a plurality of CNCs are processed simultaneously (e.g., the four segment message sequences corresponding to the example of FIG. 12).

| | Traditional Processing | Parallel Processing of Multiple Message Bundles for a Codeword | | | |
|---|---|---|---|---|---|
| Step | Sequential | Segment1 | Segment2 | Segment3 | Segment4 |
| 1 | $M^{(1)}_{1,1}$ | $M^{(1)}_{1,1}$ | $M^{(1)}_{1,2}$ | $M^{(1)}_{1,3}$ | $E^{(1)}_{1,1}$ |
| 2 | $M^{(1)}_{1,2}$ | $E^{(1)}_{1,2}$ | $E^{(1)}_{1,3}$ | $M^{(1)}_{2,1}$ | $M^{(1)}_{2,2}$ |
| 3 | $M^{(1)}_{1,3}$ | $M^{(1)}_{2,3}$ | $M^{(1)}_{2,4}$ | $E^{(1)}_{2,1}$ | $E^{(1)}_{2,2}$ |
| 4 | $E^{(1)}_{1,1}$ | $E^{(1)}_{2,3}$ | $E^{(1)}_{2,4}$ | | |
| 5 | $E^{(1)}_{1,2}$ | | | | |
| 6 | $E^{(1)}_{1,3}$ | | | | |
| 7 | $M^{(1)}_{2,1}$ | | | | |
| 8 | $M^{(1)}_{2,2}$ | | | | |
| 9 | $M^{(1)}_{2,3}$ | | | | |
| 10 | $M^{(1)}_{2,4}$ | | | | |
| 11 | $E^{(1)}_{2,1}$ | | | | |
| 12 | $E^{(1)}_{2,2}$ | | | | |
| 13 | $E^{(1)}_{2,3}$ | | | | |
| 14 | $E^{(1)}_{2,4}$ | | | | |

As with the previous table, the message processing steps in the table above represent a single iteration of decode message processing for the previously described example BG matrix $$\left(BG = \begin{pmatrix} 1 & 0 & 1 & -1 \\ 0 & 2 & 0 & 1 \end{pmatrix}\right),$$

wherein the steps provide processing with respect to the bundles of edges connecting $CNC_i$ and $VNC_1$ ($B_{1,1}$), $CNC_1$ and $VNC_2$ ($B_{1,2}$), $CNC_1$ and $VNC_3$ ($B_{1,3}$), $CNC_2$ and $VNC_1$ ($B_{2,1}$), $CNC_{1=2}$ and $VNC_2$ ($B_{2,2}$), $CNC_2$ and $VNC_3$ ($B_{2,3}$), and $CNC_2$ and $VNC_4$ ($B_{2,4}$). As with the various message flows described above, the bold message notations of the table above correspond to steps implementing min-stage calculation and the un-bolded notations correspond to steps implementing sum-stage calculation.

In the example of FIG. 12, the decode processing tasks for the codeword are partitioned and allocated to different segments of the low-latency segmented QC-LDPC decoder so that parallel processing of multiple message bundles with respect to a plurality of CNCs for a codeword is provided, as shown by the exemplary message processing steps of the table above.

In particular, the example of FIG. 12 provides parallel processing of multiple message bundles with respect to a first CNC (e.g., message bundles of edge bundles $B_{1,1}$, $B_{1,2}$, $B_{1,3}$ connected to $CNC_1$) and parallel processing of multiple message bundles with respect to a plurality of CNCs (e.g., message bundles of edge bundles $B_{1,1}$, $B_{1,2}$, $B_{1,3}$ connected to $CNC_1$ and message bundles of edge bundle $B_{2,1}$ connected to $CNC_2$). The multi-segment (e.g., four segment) codeword parallel edge bundle processing of this example low-latency segmented QC-LDPC decoder configuration performs decode processing for the decode message processing iteration in four steps. As discussed above, the sequential message processing of the traditional QC-LDPC decoder performs decode processing for the decode message processing iteration in fourteen steps. Accordingly, it can be seen that latencies experienced in the decoding process of each codeword can be appreciably reduced (e.g., on the order of 60% in the above example) by implementations of a low-latency segmented QC-LDPC decoder according to concepts of the present invention.

The decode processing tasks for the codeword of this example have been partitioned and allocated to different segments of the low-latency segmented QC-LDPC decoder so that the messages of multiple edge bundles with respect to a plurality of CNCs are processed in parallel. Accordingly, in an implementation in which the low-latency segmented QC-LDPC decoder utilizes the min-sum algorithm, not only may min-stage calculations for a plurality of message bundles be performed in parallel and sum-stage calculations for a plurality of message bundles be performed in parallel, but min-stage calculations for one or more message bundles may be performed in parallel with one or more sum-stage message bundles. The example parallel message bundle processing configuration provides operation in which the calculations that typically utilize results of other calculations (e.g., sum-stage calculations utilizing results of min-stage calculation) may be performed in some instances before the other calculations have been performed. Accordingly, the results of some calculations for the various edge bundles may not equate to results of the corresponding calculations performed in the traditional sequential decoding procedure. That is, the results of the min-stage calculations and the sum-stage calculations in the message processing steps represented for the sequential message processing steps in the above table may not be the same as all instances of the results of the corresponding min-stage calculations and the corresponding sum-stage calculations in the message processing steps represented for the parallel message processing steps. Nevertheless, low-latency segmented QC-LDPC decoder operation according to embodiments of the invention is expected to converge on a decoded codeword (i.e., all parity equations are satisfied) in approximately (e.g., ±5%) the same number of decode processing iterations. However, as shown above, each decode processing iteration of the low-latency segmented QC-LDPC decoder implements significantly fewer message processing steps than the traditional sequential message decoding process. Accordingly, even in a situation where slightly more iterations of decode processing are utilized by the multi-segment codeword parallel edge bundle processing configuration, the decoding process of codewords would be appreciably reduced.

It should be appreciated that, although the exemplary low-latency segmented QC-LDPC decoders illustrated in FIGS. 11 and 12 are shown as providing multi-segment codeword parallel edge bundle processing with respect to a single codeword, low-latency segmented QC-LDPC decoders of embodiments are scalable to accommodate various numbers of codewords for decode processing. For example, codewords from a plurality of input signals (e.g., as may correspond to signals from a plurality of connected terminals served by a base station hosting a receiver utilizing the parallel codeword QC-LDPC decoder, etc.) may be processed in parallel, wherein the parallel processing of the codewords may implement multi-segment codeword parallel edge bundle processing.

Figure 13:
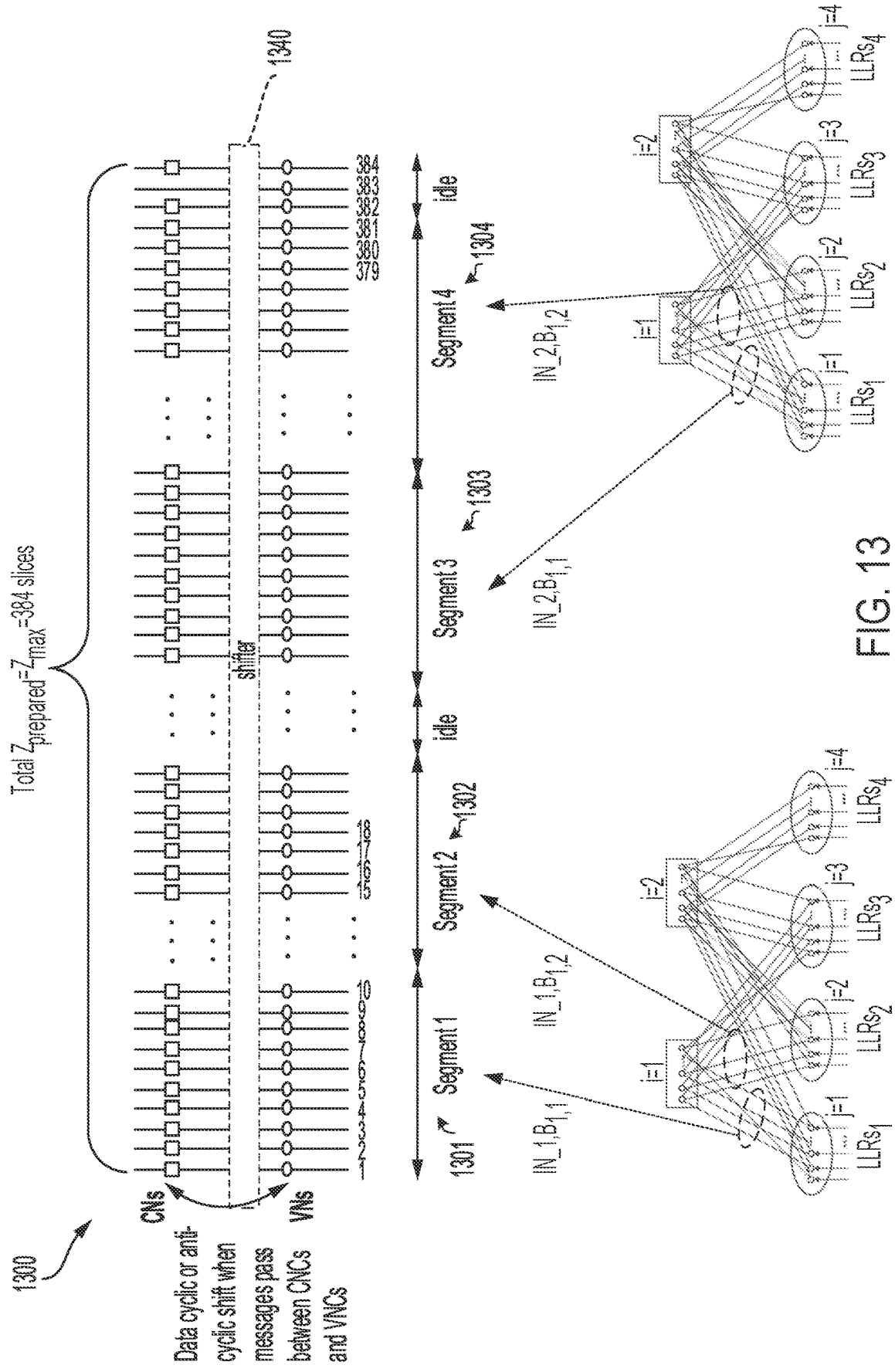

FIG. 13 shows a slice view of low-latency segmented QC-LDPC decoder 1300 implementing reconfigurable segmented scalable shifter 1340 for parallel processing of multiple bundles of edges connecting a CNC and corresponding VNCs for a plurality of codewords. As with the examples of FIGS. 11 and 12 above, low-latency segmented QC-LDPC decoder 1300 provides a multi-segment codeword parallel edge bundle processing configuration, such as may be utilized to speed up the decoding process by implementing parallel processing of bundles of messages of a codeword being decoded. The multi-segment codeword parallel edge bundle processing configuration of FIG. 13 facilitates simultaneous processing with respect to edge bundle $B_{1,1}$ for a first codeword (e.g., IN_1, $B_{1,1}$ corresponding to a code block from a first input signal of a plurality of input signals) connecting $CNC_1$ and $VNC_1$ for the first codeword, edge bundle $B_{1,2}$ for the first codeword (e.g., IN_1, $B_{1,2}$ corresponding to the code block from the first input signal) connecting $CNC_1$ and $VNC_2$ for the first codeword, edge bundle $B_{1,1}$ for a second codeword (e.g., IN_2, $B_{1,1}$ corresponding to a code block from a second input signal of the plurality of input signals) connecting $CNC_1$ and $VNC_1$ for the second codeword, and edge bundle $B_{1,2}$ for the second codeword (e.g., IN_2 $B_{1,2}$ corresponding to the code block from the second input signal) connecting $CNC_1$ and $VNC_2$ for the second codeword. That is, Segment1 (e.g., active portion 1301) of low-latency segmented QC-LDPC decoder 1300 provides decode processing with respect to the messages of edge bundle $B_{1,1}$ connecting $CNC_1$ and $VNC_1$ for the first codeword, Segment2 (e.g., active portion 1302) provides decode processing with respect to messages of edge bundle $B_{1,2}$ connecting $CNC_1$ and $VNC_2$ for the first codeword, Segment3 (e.g., active portion 1303) provides decode processing with respect to messages edge bundle $B_{1,1}$ connecting $CNC_1$ and $VNC_1$ for the second codeword, and Segment4 (e.g., active portion 1304) provides decode processing with respect to the messages of edge bundle $B_{1,2}$ connecting $CNC_1$ and $VNC_2$ for the second codeword. Reconfigurable segmented scalable shifter 1340 of embodiments thus comprises a shifter configured for dividing into multiple segments supporting simultaneous processing of decoding tasks for a plurality of codewords undergoing decoding processing. In accordance with some embodiments, reconfigurable segmented scalable shifter 1340 may comprise an instance of reconfigurable segmented scalable shifter 940 of FIG. 9 configured to process multiple bundles of edges of a plurality of codewords simultaneously.

The decode processing tasks for the plurality of codewords of this example have been partitioned and allocated to different segments of the low-latency segmented QC-LDPC decoder so that the messages of multiple edge bundles with respect to a same CNC for each of a plurality of codewords are all processed in parallel. Accordingly, as with the multi-segment codeword parallel edge bundle processing configurations of FIGS. 11 and 12, fewer steps the steps are implemented in each iteration of decode message processing.

Segmentation may be implemented for data shifting by reconfigurable segmented scalable shifters 1140, 1240, and 1340 of the above examples by providing individual data shift control with respect to each path of a data shifter stage to implement different data shift commands for the segments and control multiple data shifts in parallel. It should be appreciated, however, that low-latency segmented QC-LDPC decoders of embodiments of the invention may be constructed with different shifter core configurations. For example, embodiments of a low-latency segmented QC-LDPC decoder, and a reconfigurable segmented scalable shifter thereof, may be implemented to accommodate relatively large lifting parameters (e.g., Z=384 for a 5G QC-LDPC decoder implementation) and/or relatively large number of segments (e.g., a total of M segments, where M=floor [384/Z] and Z=size of each segment in the 5G example). Accordingly, the control signal structure of shifter core configurations implementing individual data shift control with respect to each path of a data shifter stage may become relatively complicated in some situations. Embodiments may thus implement a less complicated reconfigurable segmented scalable shifter configuration which nevertheless is reconfigurable for supporting data shifting with respect to various multi-segment codeword parallel edge bundle processing configurations.

Figure 14:
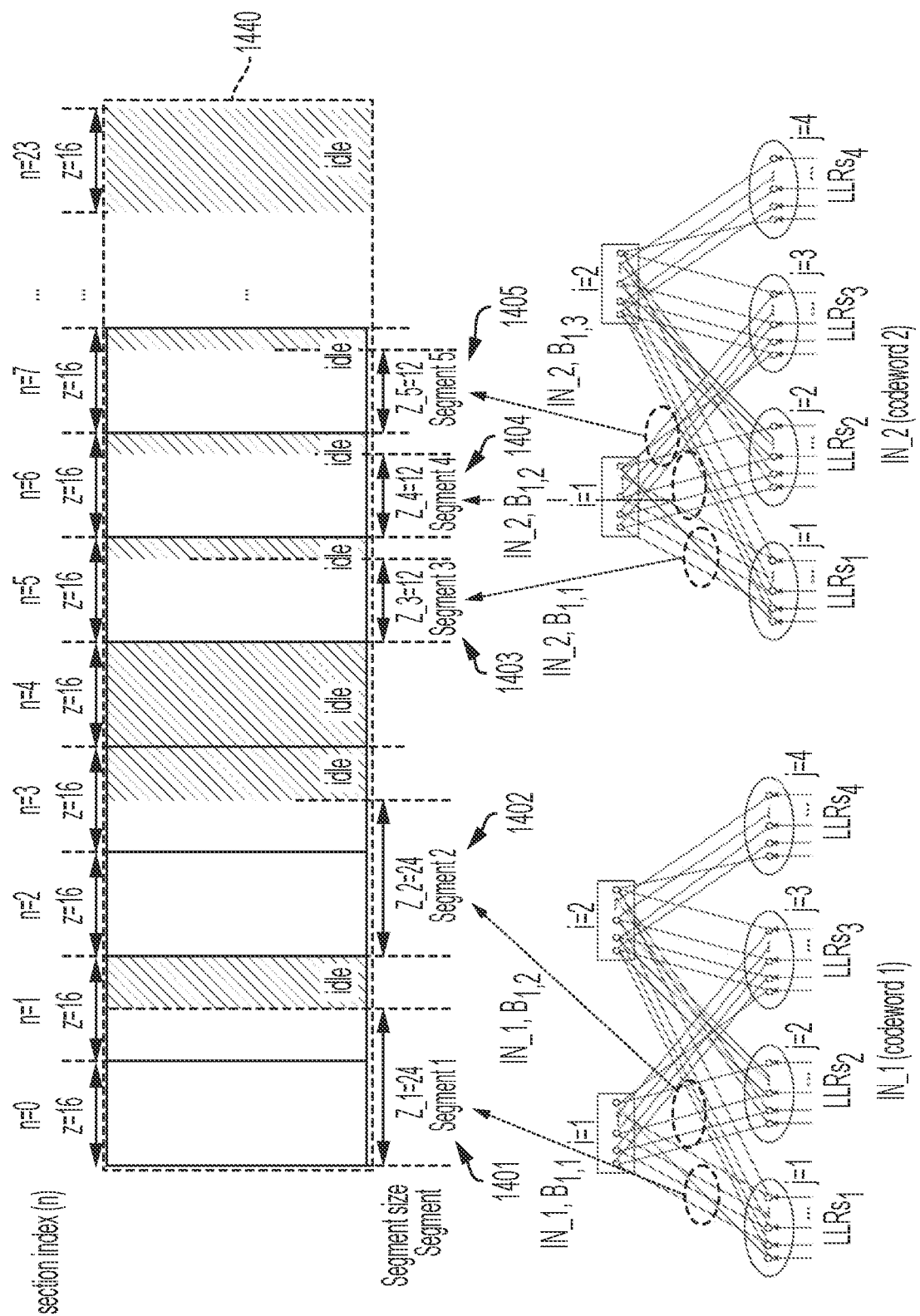
FIG. 14 shows a sectioned shifter stage configuration as may be utilized in a low-latency segmented QC-LDPC decoder of embodiments of the present invention.

FIG. 14 illustrates a reconfigurable segmented scalable shifter configuration which may be utilized in providing parallel processing of bundles of messages of one or more codewords being decoded in accordance with concepts of the present invention. Reconfigurable segmented scalable shifter 1440 shown in FIG. 14 implements a sectioned configuration in which each of the left shift and right shift portions (either one of which is represented in the illustration) are divided into multiple sections, wherein the data paths of each section share the same control signals. For example, the reconfigurable segmented scalable shifter may be divided into a plurality of sections of equal data widths, different data widths, or a combination thereof where, although each section may be controlled individually to provide different data shifting (e.g., direction and/or shift value), all data of a section is controlled together for same data shifting (e.g., direction and shift value). Such configurations may, for example, be utilized in implementations of reconfigurable segmented scalable shifters 1140, 1240, and 1340 to provide a satisfactory tradeoff between the number of segments and hardware cost.

Segmentation for implementing parallel processing of bundles of messages of one or more codewords being decoded may be implemented by configuring a group of one or more sections for each segment, wherein the group of sections for a particular segment provides an aggregate data width equal to or greater than the data width of the segment. Accordingly, bundles of messages for one or more messages may be provided data shifting in each segment as hosted by a respective group of one or more sections, wherein the message bundles may be provided individual data shifting in parallel through appropriately controlling the sections for each segment.

The number of sections (n) and the section data width (W) are preferably related to the shifter data width (N) so that the total data with is sectioned (e.g., N=n*W). In the exemplary embodiment of reconfigurable segmented scalable shifter 1440 shown in FIG. 14, the shifter data width N=384, the number of sections n=24, and the data width of each section W=16 (e.g., 384=24*16). M number of segments may be hosted by various groups of sections of reconfigurable segmented scalable shifter 1440, wherein the number of segments is less than or equal to the shifter data width (e.g., $1 \leq M \leq N$) and the aggregate size of the segments is less than or equal to the shifter data width (e.g., $N\_1+N\_2+ \ldots N\_M \leq N$).

The example of reconfigurable segmented scalable shifter 1440 shown in FIG. 14 is configured for use in multi-segment codeword parallel edge bundle processing facilitating simultaneous processing of multiple message bundles with respect to each of a plurality of codewords for which parallel LDPC decoding is provided. In particular, reconfigurable segmented scalable shifter 1440 provides the requisite shifting with respect to edge bundle $B_{1,1}$ for a first codeword (e.g., IN_1, $B_{1,1}$ corresponding to a code block from a first input signal of a plurality of input signals) connecting CNC1 and VNC1 for the first codeword, edge bundle B1,2 for the first codeword (e.g., IN_1, B1,2 corresponding to the code block from the first input signal) connecting CNC1 and VNC2 for the first codeword, edge bundle $B_{1,1}$ for a second codeword (e.g., IN_2, B1,1 corresponding to a code block from a second input signal of the plurality of input signals) connecting CNC1 and VNC1 for the second codeword, edge bundle B1,2 for the second codeword (e.g., IN_2, B1,2 corresponding to the code block from the second input signal) connecting CNC1 and VNC2 for the second codeword, and edge bundle B1,3 for the second codeword (e.g., IN_2, B1,3 corresponding to the code block from the second input signal) connecting CNC1 and VNC3 for the second codeword. That is, Segment1 (e.g., active portion 1401) of reconfigurable segmented scalable shifter 1440 provides shifting with respect to the messages of edge bundle B1,1 connecting CNC1 and VNC1 for the first codeword, Segment2 (e.g., active portion 1402) provides shifting with respect to messages of edge bundle B1,2 connecting CNC1 and VNC2 for the first codeword, Segment3 (e.g., active portion 1403) provides shifting with respect to messages edge bundle B1,1 connecting CNC1 and VNC1 for the second codeword, Segment4 (e.g., active portion 1404) provides shifting with respect to the messages of edge bundle B1,2 connecting CNC1 and VNC2 for the second codeword, and Segment5 (e.g., active portion 1405) provides shifting with respect to the messages of edge bundle B1,3 connecting CNC1 and VNC3 for the second codeword. Reconfigurable segmented scalable shifter 1440 of embodiments thus comprises a shifter configured for dividing into multiple segments supporting simultaneous processing of decoding tasks for a plurality of codewords undergoing decoding processing.

Reconfigurable segmented scalable shifter 1440 of embodiments is configured for dividing into multiple segments by combining a plurality of successive sections to form a data shifter for accommodating data widths larger than the individual sections. For example, in the example of FIG. 14, sections n=0 and n=1 are combined for Segment1 and sections n=2 and n=3 are combined for Segment2, providing active portions 1401 and 1402 for use with respect to message bundles of the first codeword having a data width greater than the respective sections (e.g., Z>W). Also in the example of FIG. 14, section n=5 is used for Segment3, section n=6 is used for Segment4, and n=7 is used for Segment5, providing active portions 1403, 1404, and 1405 for use with respect to message bundles of the second codeword having a data width less than or equal to the respective sections (e.g., $Z \leq W$). Such reconfigurable segmented scalable shifter configurations provide for fully reconfigurable data width and shift command of each message of input data and are well suited for use with respect to embodiments of parallel LDPC decoder 200. For example, in operation of a receiver in a 5G network (e.g., implementing 5G BG1), if N=24 and W=16, then parallel LDPC decoder 200 of embodiments can simultaneously decoding 24 code blocks with lifting parameter $Z \leq 16$.

The foregoing sectioned shifter core configuration implements common data shift control with respect to each path of a section, and thus less control signals are utilized in providing operational control of the shifter core. However, as can be seen in the illustrated example of the sectioned configuration of reconfigurable segmented scalable shifter 1440, the unused portion of a section of an otherwise active section stays idle. One or more unused (e.g., idle) sections may be present between the sections forming segments of a codeword or codewords (e.g., section n=4 remaining unused between Segment2 for the first codeword and Segment3 for the second codeword).

FIGS. 15A-15E show detail with respect to an implementation of low-latency segmented QC-LDPC decoder 1500 configured for parallel processing of multiple message bundles for a codeword undergoing a decoding process in accordance with concepts of the present invention. In the illustrations of FIGS. 15A-15E, the notation $M_{i,j}^{(t)}$ indicates a V2C message ($M_{i,j}^{(t+1)}$ is a V2C message after an iteration of cyclic shift), $E_{i,j}^{(t)}$ indicates a C2V message ($E_{i,j}^{(t)}$ is a C2V message after an iteration of cyclic shift), $SUM_j^{(t)}$ indicates a variable node message, (t) indicates the iteration number, i indicates the index of the CNC, and j indicates the index of the VNC.

In accordance with some examples, low-latency segmented QC-LDPC decoder 1500 may be configured for use with respect to a receiver in a 5G network, and thus may accommodate decoding of code blocks having various lifting parameter sizes up to lifting parameter Z=384. In such a configuration of embodiments, connections in the data paths carry 384 soft messages. Likewise, various of the components in the embodiment of low-latency segmented QC-LDPC decoder 1500 shown in FIG. 15A (FIGS. 15A-1 and 15A-2) may be appropriately scaled. For example, embodiments of low-latency segmented QC-LDPC decoder 1500 may comprise 384 instances of adder/subtractor logic 1501, corresponding to a largest accommodated lifting parameter Z=384.

Figures 1, 15A:
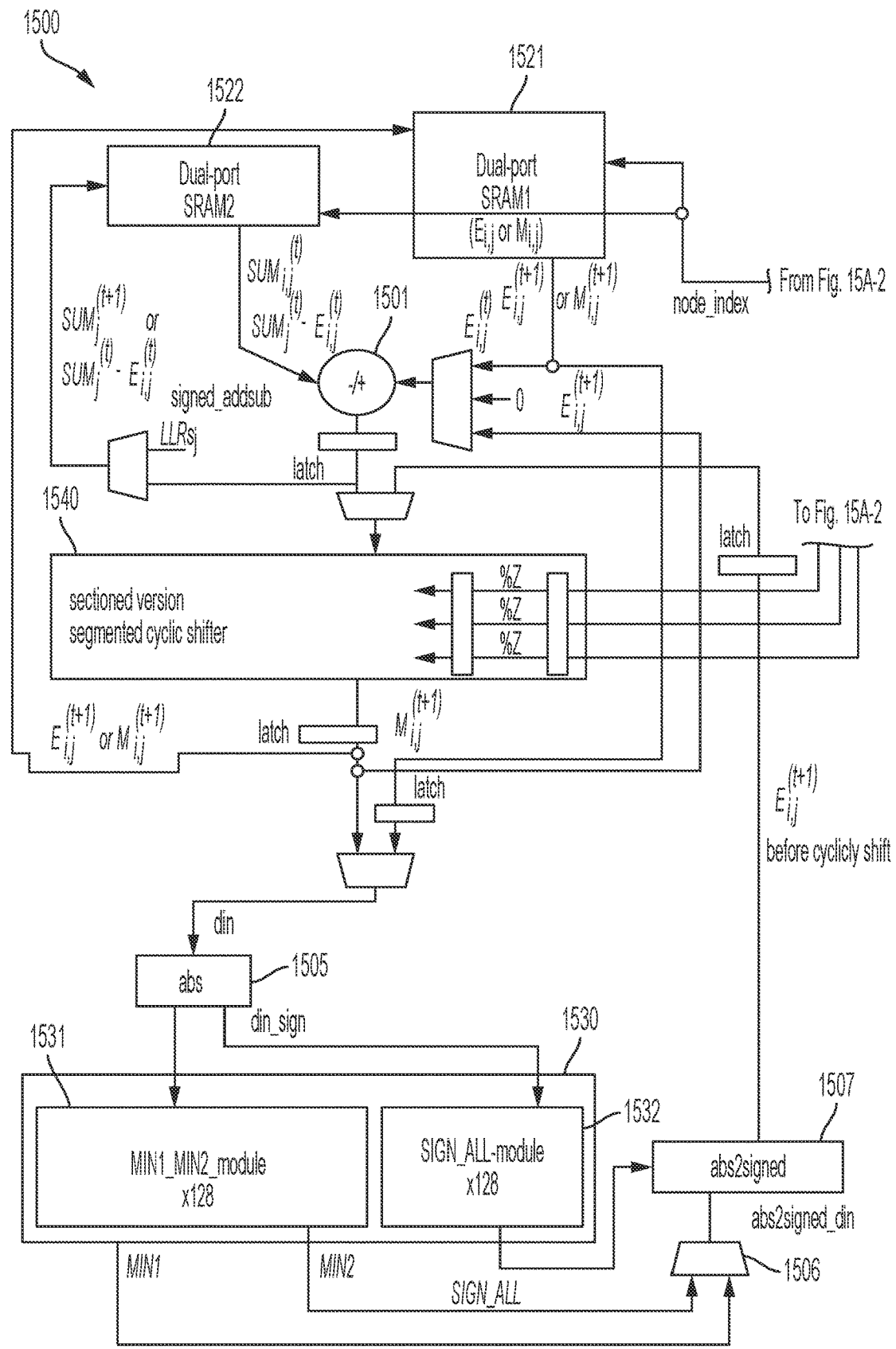
Figures 2, 15A:
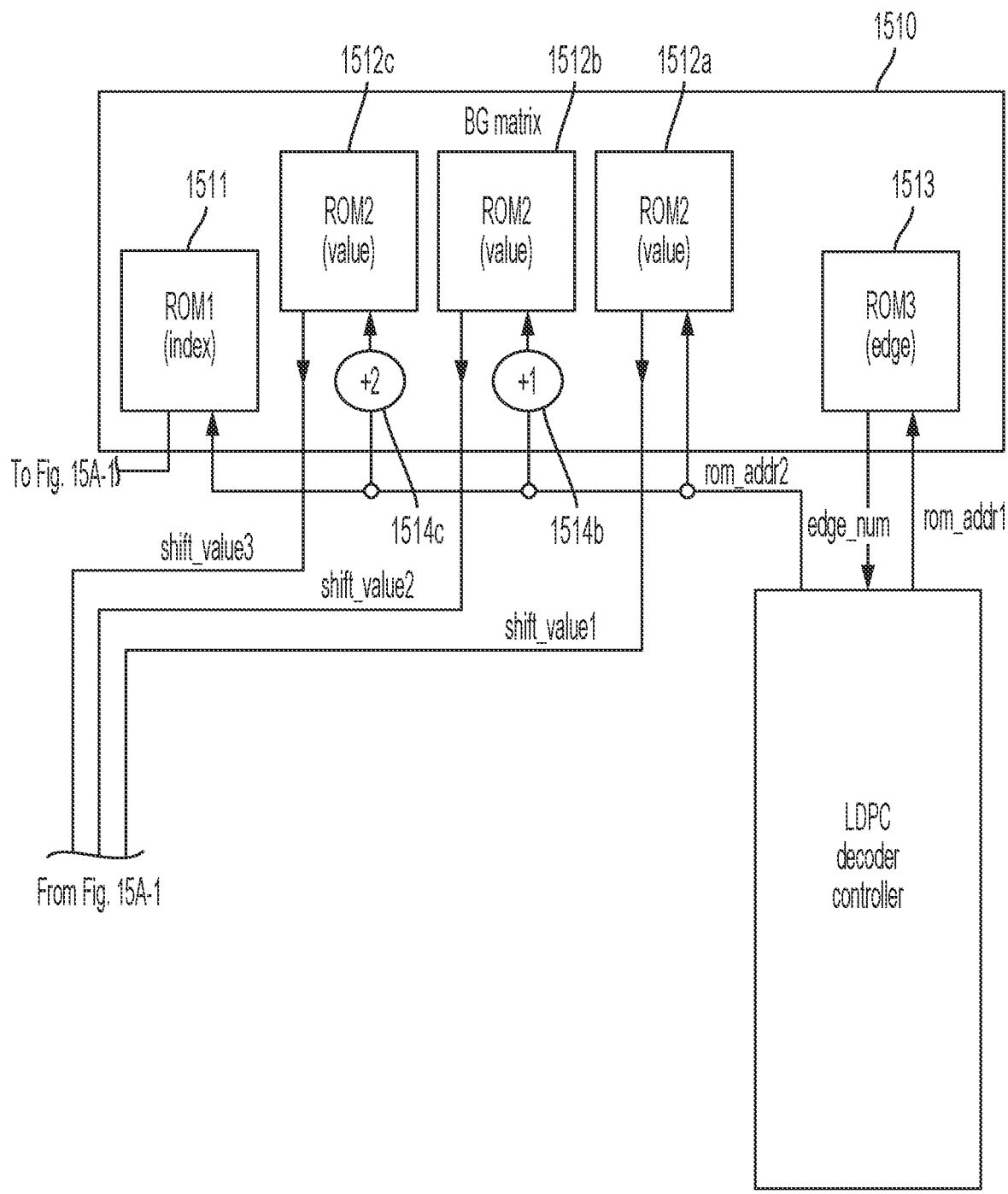

Low-latency segmented QC-LDPC decoder 1500 shown in FIG. 15A (FIGS. 15A-1 and 15A-2) illustrates an example hardware implementation configured for parallel processing of 3 message bundles for a codeword undergoing a decoding process (e.g., an implementation of low-latency segmented QC-LDPC decoder 1100 of the example of FIG. 11 described above). Accordingly, BG matrix 1510 utilized in the QC-LDPC decoding operation shown in the example of FIG. 15A (FIGS. 15A-1 and 15A-2) includes 3 instances of ROM2 (e.g., ROM2 1512*a*-1512*c*) storing value information for the BG matrix, in addition to ROM1 1511 storing index information for the BG matrix and ROM3 1513 storing edge information for the BG matrix. In the illustrated example, the adders (e.g., adder 1514*b* corresponding to ROM2 1512*b* and adder 1514*c* corresponding to ROM2 1512*c*) shown in the address paths (e.g., rom_adder2) of instances of ROM2 provide for next locations of the memory.

It should be appreciated that implementations of low-latency segmented QC-LDPCs may be configured for parallel processing of various numbers message bundles by including the requisite instances of BG matrix value data, and thus are not limited to the 3 message bundle example of FIGS. 15A-15E. For example, parallel processing of 4 message bundles for a codeword undergoing a decoding process, such as in the examples of low-latency segmented QC-LDPC decoders 1200 and 1300 of FIGS. 12 and 13 above, may be provided by including the requisite instances of BG matrix value ROM data (e.g., provided by additional instances of ROM2). The duplication of some memory elements may be avoided or mitigated (e.g., reducing the duplicated instances) in accordance with some embodiments, such as by utilizing multi-port memory supporting simultaneous access capabilities (e.g., multi-port RAM in place of multiple instances of ROM2 of the illustrated example).

Low-latency segmented QC-LDPC decoder 1500 of the illustrated example utilizes multi-port memory supporting simultaneous access capabilities with respect to messages for parallel processing of multiple message bundles for a codeword undergoing decoding. For example, SRAM1 1521 and SRAM2 1522 are shown in the illustrated embodiment as comprising dual-port memory configurations. SRAM1 1521 of the example provides storage of V2C and C2V messages and SRAM2 1522 of the example provides storage of variable node messages. The multi-port implementations of SRAM1 1521 and SRAM2 1522 facilitate concurrent access with respect to various of the messages as may be invoked by the parallel processing of message bundles according to concepts herein.

Reconfigurable segmented scalable shifter 1540 of embodiments of low-latency segmented QC-LDPC decoder 1500 comprises a segmented shifter implementation configured for bundling edges of one or more CNCs of the low density segmented QC-LDPC decoder. Reconfigurable segmented scalable shifter 1540 may, for example, comprise a configuration providing individual data shift control with respect to each path of a data shifter stage, such as described above with respect to reconfigurable segmented scalable shifters 1140, 1240, and 1340. Additionally or alternatively, reconfigurable segmented scalable shifter 1540 of embodiments may comprise a sectioned configuration in which the data paths of each section share the same control signals, such as described above with respect to reconfigurable segmented scalable shifter 1440.

Low-latency segmented QC-LDPC decoder 1500 of the illustrated embodiment utilizes the min-sum algorithm in decoding code blocks. In operation of low-latency segmented QC-LDPC decoder 1500, messages passed from VNCs to a connected CNC may be computed by logic of the low-latency segmented QC-LDPC decoder (e.g., using adder/subtractor logic 1501) from the data previously provided in the messages passed from the CNC in a prior iteration of the decoding. Min-sum logic 1530 of low-latency segmented QC-LDPC decoder 1500 in the illustrated example includes min-sum logic 1530 utilized in providing messages passed from the CNC to the connected VNCs.

Figure 15B:
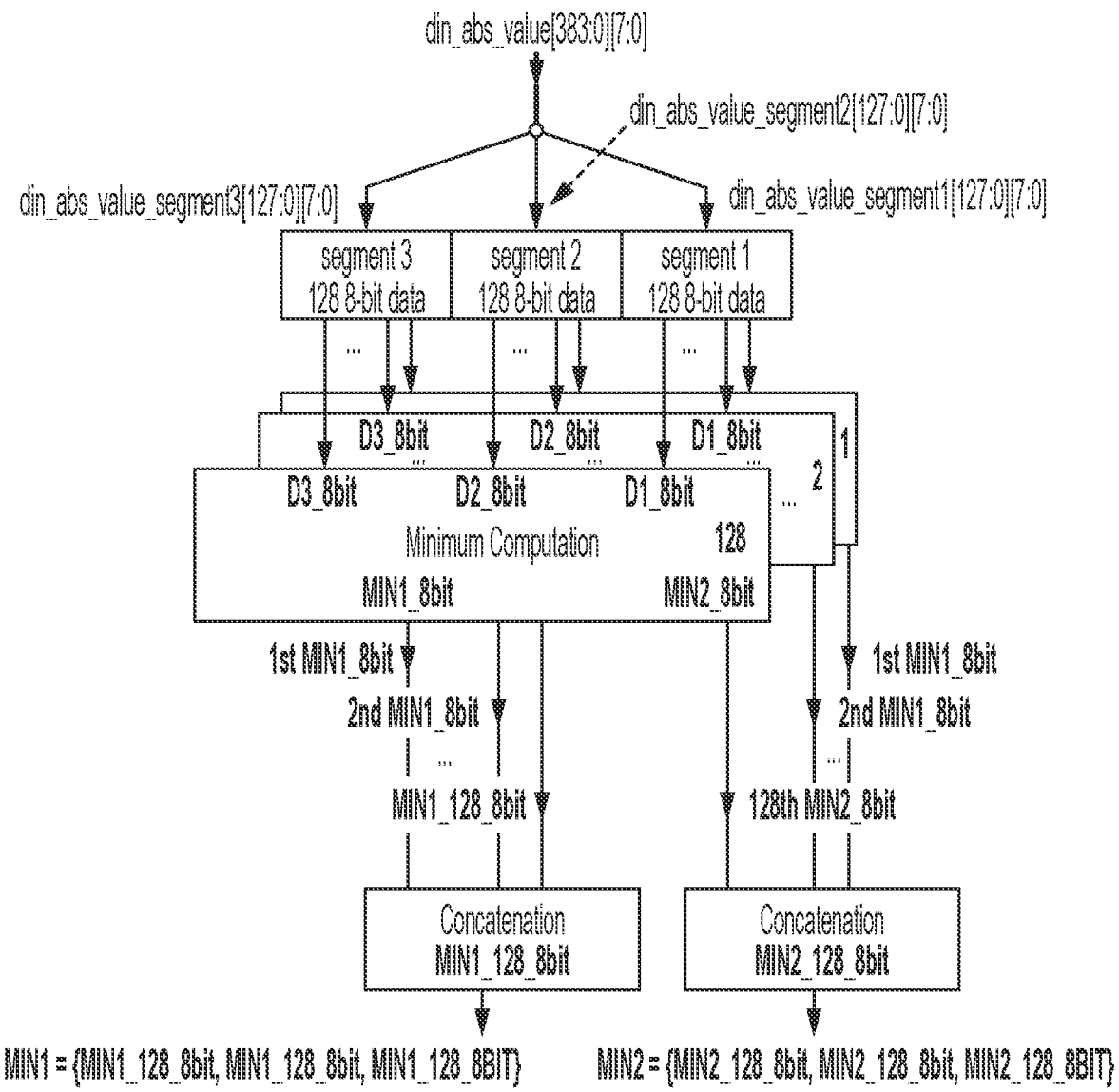
Figure 15C:
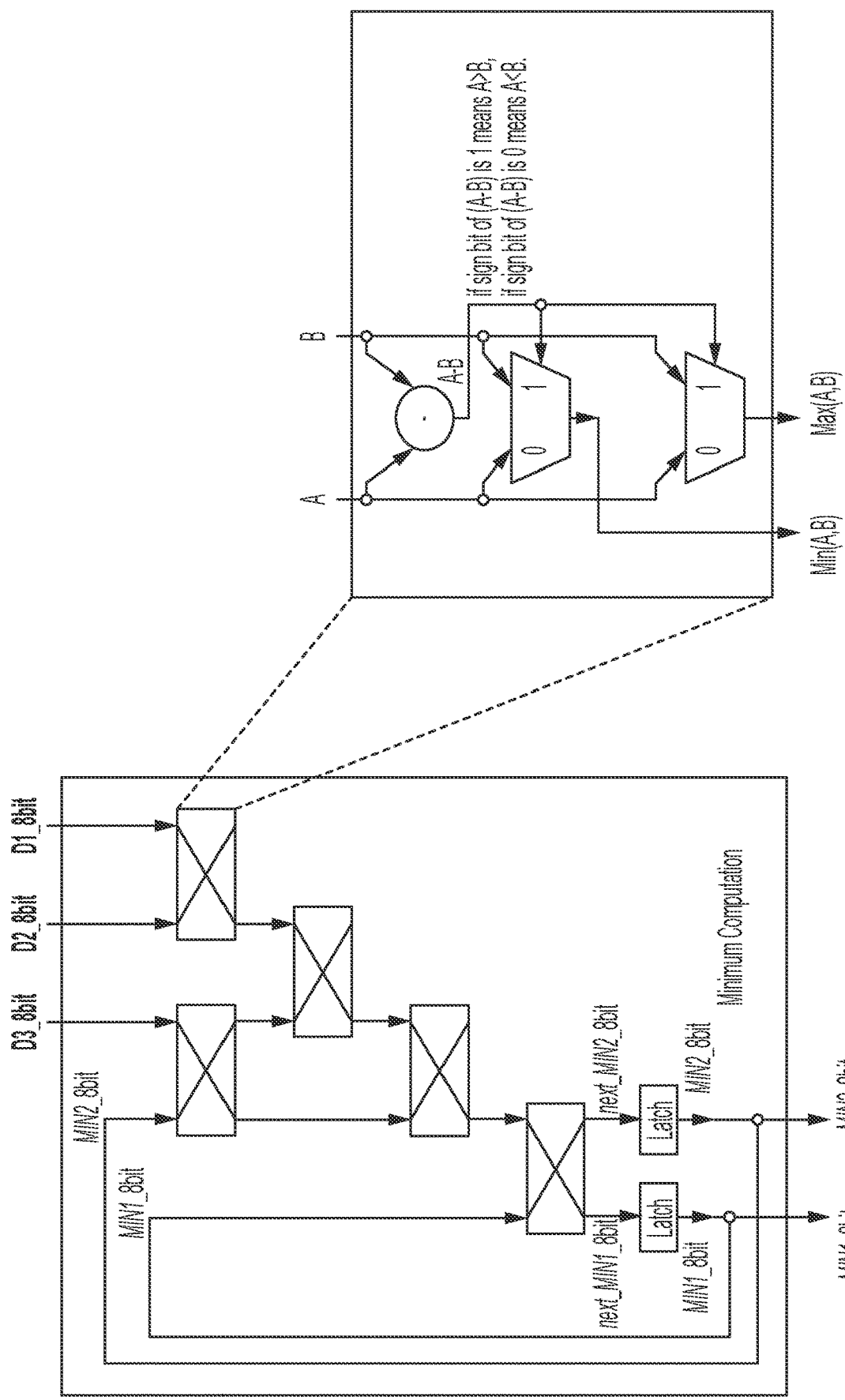

Operation of abs module 1505, min-sum logic 1530, comparator module 1506, and sign module 1507 of embodiments provides the check node messages (before cyclic shift) of the decoding processing of low-latency segmented QC-LDPC decoder 1500. In operation according to embodiments, MIN1_MIN2 module 1531 of min-sum logic 1530 may compute a first minimum (MIN1) and a second minimum (MIN2) with respect to messages passed from VNCs to a connected CNC for determining a magnitude with respect to the messages passed from the CNC to the connected VNCs, as described above with respect to implementation of the min-sum algorithm. FIGS. 15B and 15C show detail with respect to an example implementation of MIN1_MIN2 module 1531 of embodiments. In particular, FIG. 15B shows a functional block diagram of an implementation of MIN1_MIN2 module 1531 of an example implementing minimum computation logic and concatenation logic supporting segmentation facilitating parallel processing of message bundles. FIG. 15C shows details with respect to minimum computation logic of FIG. 15B in which comparison modules are implemented to move the smaller number of (A, B) to the left for minimum computation.

In the illustrated example, data provided by abs module 1505 (e.g., absolute values determined by abs module 1505) and input into MIN1_MIN2 module 1531 comprises 384 8-bit soft messages (e.g., Z=384 and din_abs_value[383:0][7:0]). In this example, low-latency segmented QC-LDPC decoder 1500 is configured for parallel processing of 3 message bundles for a codeword undergoing decoding, and thus the input data is divided into 3 segments. For example, segment 1 (e.g., din_abs_value_segment1[127:0][7:0]= din_abs_value[127:0][7:0]), segment 2 (e.g., din_abs_value_segment2[127:0][7:0]=din_abs_value[255:128][7:0]), and segment 3 (e.g., din_abs_value_segment3[127:0][7:0]=din_abs_value[383:256][7:0]) are shown in the example, each occupying 128 8-bit data.

As described above with respect to min-sum algorithm operation, MIN1_MIN2 module 1531 computes a first minimum with respect to the messages passed from the VNCs connected to a CNC. Here, however, in contrast to traditional min-sum designs where the data of message bundles for a codeword would be provided in sequential manner, the three 128 8-bit data segments are provided in parallel. Therefore, the minimum is not only the minimum among the successively incoming data, but is also the minimum among the segments being processed in parallel. By way of specific example, where the input "din_abs_value" is 384 8-bit data and is divided into three 128 8-bit data segments in which the first 128 8-bit data is 20, 12, . . . , 100; the second 128 8-bit data is 30, 10, . . . , 1; and the third 128 8-bit data is 9, 70, . . . , 30; the first minimum data is 9, because it is minimum among 20, 30, and 9. In operation according to the example, the first minimum results of the parallel minimum computation are concatenated to provide a first minimum result (e.g., MIN1[383:0][7:0]=(MIN1_128_8 bit[127:0][7:0], MIN1_128_8 bit[127:0][7:0], MIN1_128_8 bit[127:0][7:0]). The MIN1_128_8 bit result is the first minimum amounts for segment 1, segment 2, and segment 3. The 128 8-bit data, MIN1_128_8 bit, will be duplicated three times respectively for segment 1, segment 2 and segment 3, to be MIN1.

Also as described above with respect to min-sum algorithm operation, MIN1_MIN2 module 1531 computes a second minimum with respect to the messages passed from the VNCs connected to a CNC. Similar to the first minimum discussed above, computation of a second minimum is not only with respect to the minimum among the successively incoming data, but is also the minimum among the segments being processed in parallel. In operation according to the example, the second minimum results of the parallel minimum computation results are concatenated to provide a second minimum result (e.g., MIN2[383:0][7:0]=(MIN2_128_8 bit[127:0][7:0], MIN2_128_8 bit[127:0][7:0], MIN2_128_8 bit[127:0][7:0]). The MIN2_128_8 bit result is the second minimum amounts for segment 1, segment 2, and segment 3. The 128 8-bit data, MIN2_128_8 bit, will be duplicated three times respectively for segment 1, segment 2 and segment 3, to be MIN2.

Figure 15D:
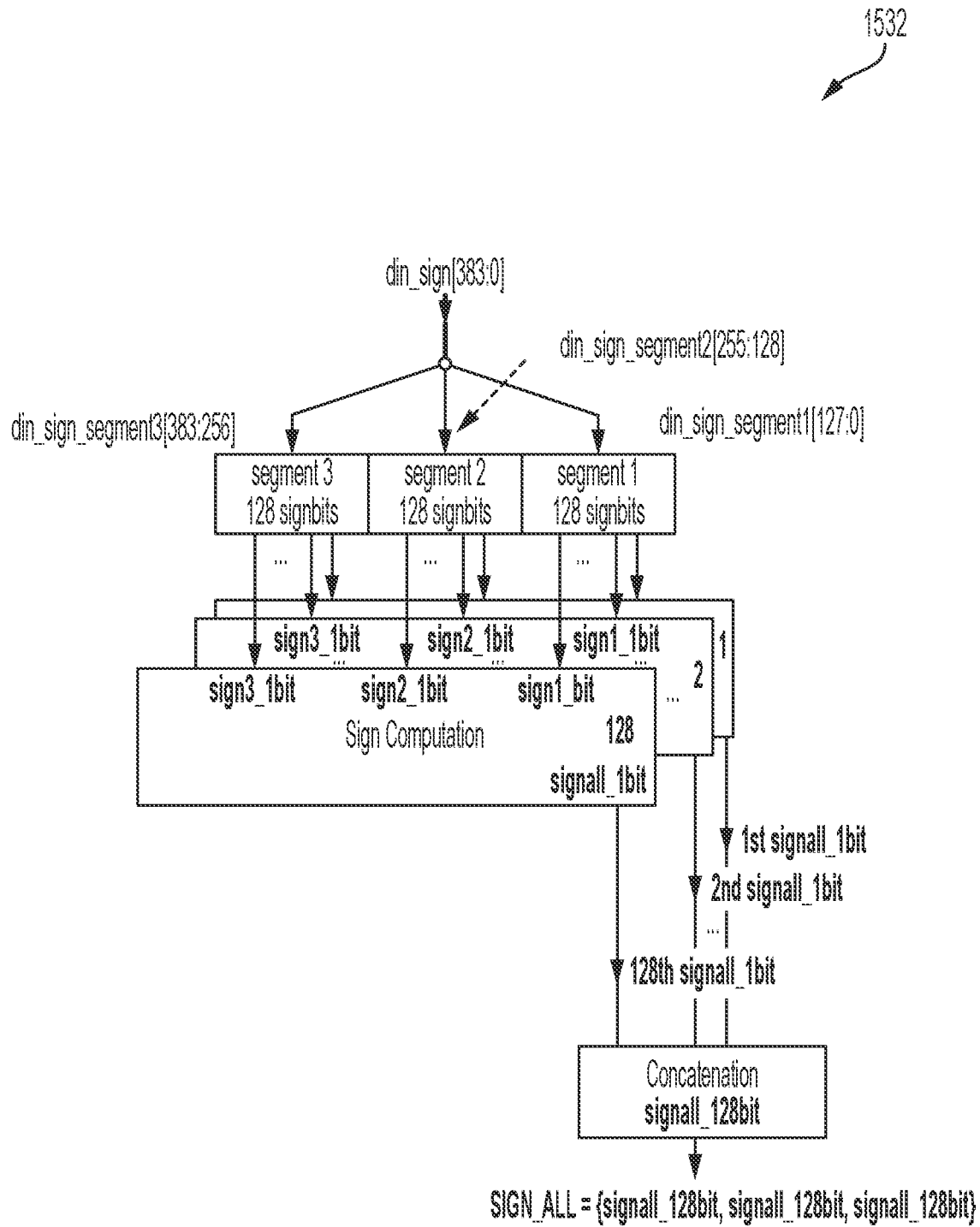
Figure 15E:
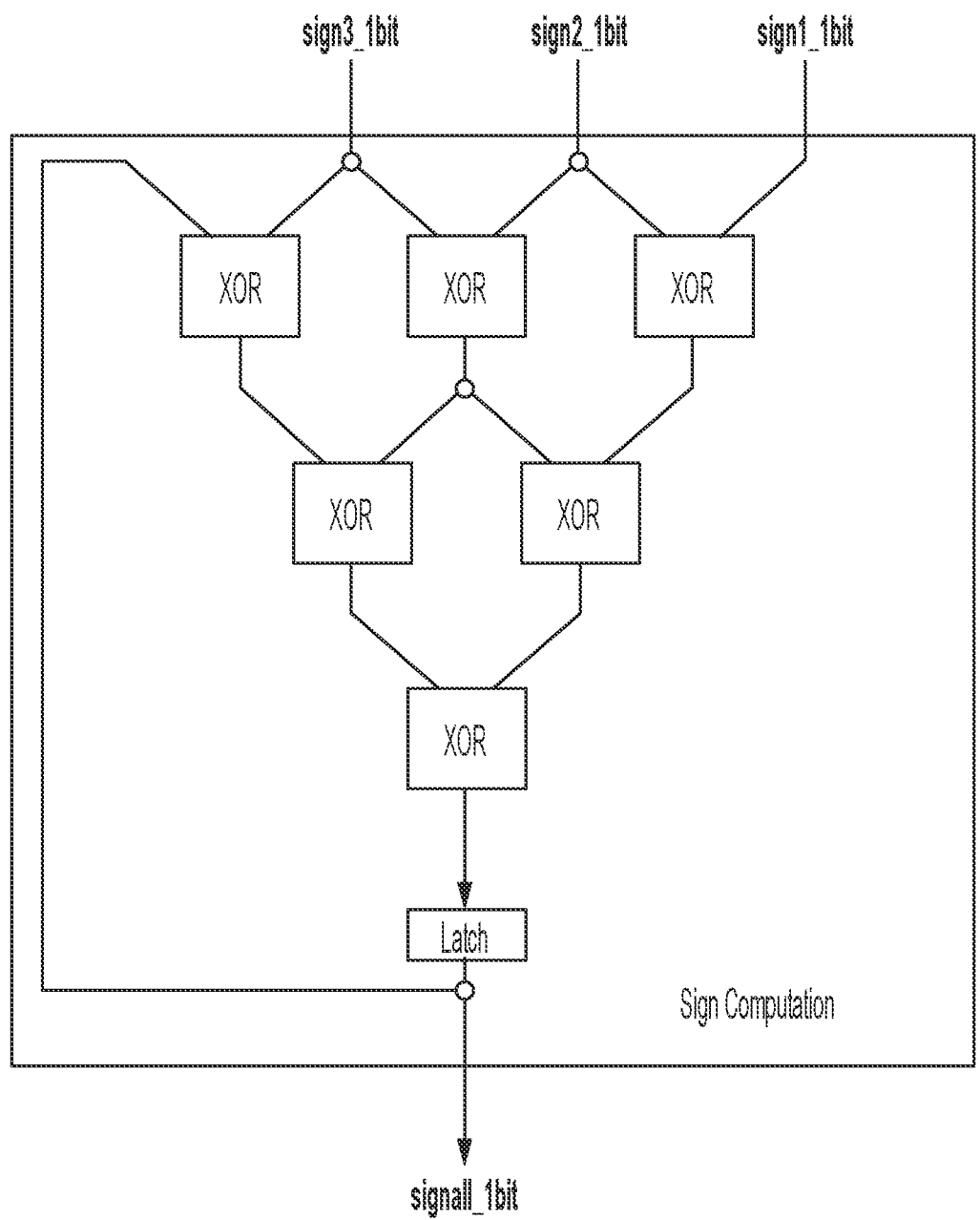

In operation according to embodiments, SIGN_ALL module 1532 of min-sum logic 1530 may determine a sign (e.g., SIGN_ALL) for the messages passed from the VNCs connected to a CNC, as described above with respect to implementation of the min-sum algorithm. FIGS. 15D and 15E show detail with respect to an example implementation of SIGN_ALL module 1532 of embodiments. In particular, FIG. 15D shows a functional block diagram of an implementation of SIGN_ALL module 1532 of an example implementing sign computation logic and concatenation logic supporting segmentation facilitating parallel processing of message bundles. FIG. 15E shows details with respect to the sign computation logic of FIG. 15D in which XOR gate logic is implemented for sign computation.

In the illustrated example, signs provided by abs module 1505 (e.g., signs corresponding to the absolute values determined by abs module 1505) and input into SIGN_ALL module 1532 comprises 384 signs (e.g., Z=384 and din_sign [383:0]). In this example, low-latency segmented QC-LDPC decoder 1500 is configured for parallel processing of 3 message bundles for a codeword undergoing decoding, and thus the input data is divided into 3 segments. For example, segment 1 (e.g., din_sign_segment1[127:0]=din_sign[127:0]), segment 2 (e.g., din_sign_segment2[127:0]=din_sign [255:128]), and segment 3 (e.g., din_sign_segment3 [127:0]=din_sign[383:256]) are shown in the example, each occupying 128 1-bit data (e.g., sign=1 is negative).

As described above with respect to min-sum algorithm operation, SIGN_ALL module 1532 computes signs with respect to the messages passed from the VNCs connected to a CNC. Here, as with the first and second minimums computed above, sign computation * is not only with respect to the successively incoming data, but is also with respect to the segments being processed in parallel. In operation according to the example, the sign results of the parallel computation are concatenated to provide a sign result (e.g., SIGN_ALL (e.g., SIGN_ALL[383:0]=signal1_128 bit[127:0], signal1_128 bit[127:0], signal1_8 bit[127:0])). The SIGN_ALL_128_1 bit result is the signs for segment 1, segment 2, and segment 3. The 128 1-bit data, SIGN_ALL_128_1 bit, will be duplicated three times respectively for segment 1, segment 2 and segment 3, to be SIGN_ALL.

Comparator module 1506 of embodiments analyzes the first minimum data provided by MIN1_MIN2 module 1531 with respect to the V2C messages in determining a magnitude of the C2V message (e.g., MIN1 or MIN2), as described above with respect to min-sum algorithm operation. Thereafter, sign module 1507 appends the corresponding sign to provide the check node messages (before cyclic shift).

It should be appreciated from the foregoing that operation of embodiments of a low-latency segmented QC-LDPC decoder implementing multi-segment parallel codeword edge bundle processing according to concepts of the present invention reduces decoding latency. In particular, decoding latency for small size signaling data which uses small codeword size may be reduced according to implementations of a low-latency segmented QC-LDPC decoder of embodiments. Such reduced latency is advantageous in supporting communications requiring low-latency and reliable communication services, such as V2X communications. Moreover, reduced latency provided by low-latency segmented QC-LDPC decoders of embodiments can help 5G base station or other communication device (e.g., UE) enter low power mode earlier after finishing decoding (e.g., during frame time slots in which no data communication is scheduled for the device). It should be appreciated that decoder logic can consume almost half of computation power of a cellular receiver, and thus the flexibility and efficiencies provided by low-latency segmented QC-LDPC decoders implemented in accordance with concepts herein can help reduce the latency by parallelly processing of multiple edges.

Although the present disclosure and its advantages have been described in detail, it should be understood that various changes, substitutions and alterations can be made herein without departing from the spirit and scope of the design as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

Moreover, the scope of the present application is not intended to be limited to the particular embodiments of the process, machine, manufacture, composition of matter, means, methods and steps described in the specification.

What is claimed is:

1. A system comprising:
a segmented quasi-cyclic low-density parity-check (QC-LDPC) decoder including a reconfigurable segmented shifter and configured to implement multi-segment codeword parallel edge bundle processing to simultaneously process multiple bundles of edges for a first codeword using multiple segments of the reconfigurable segmented shifter and one or more bundles of edges for a second codeword using one or more segments of the reconfigurable segmented shifter, wherein the reconfigurable segmented shifter has a largest accommodated code block size (Zmax) and is reconfigurable with respect to a number of segments and a size of the segments for the multi-segment codeword parallel edge bundle processing, wherein the multiple bundles of edges for the first codeword comprise a first edge bundle connecting a first check node cluster (CNC) of a plurality of check nodes (CNs) for the first codeword and a first variable node cluster (VNC) of a plurality of variable nodes (VNs) for the first codeword and a second edge bundle connecting the first CNC and a second VNC of a plurality of VNs for the first codeword, wherein the multiple bundles of edges for the first codeword comprise a first number of bundles of edges corresponding to a first number of segments (M) of the multiple segments of the reconfigurable segmented shifter, the one or more bundles of edges for the second codeword comprise a second number of bundles of edges corresponding to a second number of segments (N) of the one or more segments of the reconfigurable segmented shifter, and wherein a total number of segments of the first number of segments (M) and of the second number of segments (N) is less than or equal to the largest accommodated code block size (Zmax).

2. The system of claim 1, wherein a number of CNs of each CNC for the first codeword and a number of VNs of each VNC for the first codeword are a first value ($Z_1$) resulting in the bundles of edges connecting the CNCs for the first codeword with the VNCs for the first codeword each comprising the first value ($Z_1$) number of edges, and wherein the largest accommodated code block size (Zmax) is greater than a product of the first number of segments (M) and the first value ($Z_1$) (Zmax>M*$Z_1$).

3. The system of claim 1, wherein the segmented QC-LDPC decoder processes a plurality of VN to CN message bundles in parallel and a plurality of CN to VN message bundles in parallel, wherein the plurality of VN to CN message bundles comprise a message bundle passed from the first VNC to the first CNC via a first bundle of edges of the multiple bundles of edges and a message bundle passed from the second VNC to the first CNC via a second bundle of edges of the multiple bundles of edges, and wherein the plurality of CN to VN message bundles comprise a message bundle passed from the first CNC to the first VNC via the first bundle of edges and a message bundle passed from the first CNC to the second VNC via the second bundle of edges.

4. The system of claim 1, wherein the multiple bundles of edges for the first codeword comprise a third edge bundle connecting a second CNC of a plurality of CNs for the first codeword.

5. The system of claim 4, wherein the segmented QC-LDPC decoder processes a plurality of VN to CN message bundles and one or more CN to VN message bundles in parallel and a plurality of CN to VN message bundles and one or more VN to CN message bundles in parallel, wherein the plurality of VN to CN message bundles comprise a message bundle passed from the first VNC to the first CNC via a first bundle of edges of the multiple bundles of edges and a message bundle passed from the second VNC to the first CNC via a second bundle of edges of the multiple bundles of edges, wherein the one or more CN to VN message bundles comprise a message bundle passed from the second CNC to the first VNC via a third bundle of edges of the multiple bundles of edges, wherein the plurality of CN to VN message bundles comprise a message bundle passed from the first CNC to the first VNC via the first bundle of edges and a message bundle passed from the first CNC to the second VNC via the second bundle of edges, and wherein the one or more VN to CN message bundles comprise a message bundle passed from the first VNC to the second CNC via the third bundle of edges of the multiple bundles of edges.

6. The system of claim 1, wherein the one or more bundles of edges for the second codeword comprise a first edge bundle connecting a CNC of a plurality of CNs for the second codeword and a VNC of a plurality of VNs for the second codeword.

7. The system of claim 6, wherein a number of CNs of each CNC for the first codeword and a number of VNs of each VNC for the first codeword are a first value ($Z_1$) resulting in the bundles of edges connecting the CNCs for the first codeword with the VNCs for the first codeword each comprising the first value ($Z_1$) number of edges, wherein a number of CNs of each CNC for the second codeword and a number of VNs of each VNC for the second codeword are a second value ($Z_2$) resulting in the bundles of edges connecting the CNCs for the second codeword with the VNCs for the second codeword each comprising the second value ($Z_2$) number of edges, and wherein the largest accommodated code block size (Zmax) is greater than or equal to a sum of a product of the first number of segments (M) and the first value ($Z_1$) and a product of the second number of segments (N) and the second value ($Z_2$)(Zmax≥(M*$Z_1$)+(N*$Z_2$)).

8. The system of claim 1, wherein the reconfigurable segmented shifter comprises:
a sectioned reconfigurable segmented shifter having a plurality of sections, wherein each data path of a section of the plurality of sections shares a same control signal, and wherein each bundle of edges of the multiple bundles of edges for the first codeword and each bundle of edges of the one or more bundles of edges for the second codeword processed simultaneously are processed by one or more different sections of the plurality of sections than are each other bundle of edges of the multiple bundles of edges and of the one or more bundles of edges.

9. A method comprising:
inputting, to a segmented quasi-cyclic low-density parity-check (QC-LDPC) decoder configured to implement multi-segment codeword parallel edge bundle processing, a first code block for decoding as a first codeword and a second code block for decoding as a second codeword;
processing, simultaneously by the segmented QC-LDPC decoder utilizing a reconfigurable segmented shifter, multiple bundles of edges for the first codeword using multiple segments of the reconfigurable segmented shifter and one or more bundles of edges for the second codeword using one or more segments of the reconfigurable segmented shifter to separately provide shifting with respect to each message bundle of the multiple bundles of edges for the first codeword and the one or more bundles of edges for the second codeword, wherein the multiple bundles of edges for the first codeword comprise a first edge bundle connecting a first check node cluster (CNC) of a plurality of check nodes (CNs) for the first codeword and a first variable node cluster (VNC) of a plurality of variable nodes (VNs) for the first codeword and a second edge bundle connecting the first CNC and a second VNC of a plurality of VNs for the first codeword, wherein the reconfigurable segmented shifter is reconfigurable with respect to a number of segments and a size of the segments for the multi-segment codeword parallel edge bundle processing; and outputting, by the segmented QC-LDPC decoder, a decoded instance of the first codeword and a decoded instance of the second codeword.

10. The method of claim 9, wherein simultaneously processing multiple bundles of edges for the first codeword and one or more bundles of edges for the second codeword comprises:

processing a plurality of VN to CN message bundles in parallel, wherein the plurality of VN to CN message bundles comprise a message bundle passed from the first VNC to the first CNC via a first bundle of edges of the multiple bundles of edges and a message bundle passed from the second VNC to the first CNC via a second bundle of edges of the multiple bundles of edges; and processing a plurality of CN to VN message bundles in parallel, wherein the plurality of CN to VN message bundles comprise a message bundle passed from the first CNC to the first VNC via the first bundle of edges and a message bundle passed from the first CNC to the second VNC via the second bundle of edges.

11. The method of claim 9, wherein the multiple bundles of edges for the first codeword comprise a third edge bundle connecting a second CNC of a plurality of CNs for the first codeword.

12. The method of claim 11, wherein simultaneously processing multiple bundles of edges for the first codeword and one or more bundles of edges for the second codeword comprises:

processing a plurality of VN to CN message bundles and one or more CN to VN message bundles in parallel, wherein the plurality of VN to CN message bundles comprise a message bundle passed from the first VNC to the first CNC via a first bundle of edges of the multiple bundles of edges and a message bundle passed from the second VNC to the first CNC via a second bundle of edges of the multiple bundles of edges, wherein the one or more CN to VN message bundles comprise a message bundle passed from the second CNC to the first VNC via a third bundle of edges of the multiple bundles of edges; and processing a plurality of CN to VN message bundles and one or more VN to CN message bundles in parallel, wherein the plurality of CN to VN message bundles comprise a message bundle passed from the first CNC to the first VNC via the first bundle of edges and a message bundle passed from the first CNC to the second VNC via the second bundle of edges, and wherein the one or more VN to CN message bundles comprise a message bundle passed from the first VNC to the second CNC via the third bundle of edges of the multiple bundles of edges.

13. The method of claim 9, wherein the one or more bundles of edges for the second codeword comprise a first edge bundle connecting a CNC of a plurality of CNs for the second codeword and a VNC of a plurality of VNs for the second codeword.

14. The method of claim 9, wherein the reconfigurable segmented shifter comprises a sectioned reconfigurable segmented shifter having a plurality of sections, wherein each data path of a section of the plurality of sections shares a same control signal, and wherein each bundle of edges of the multiple bundles of edges for the first codeword processed simultaneously are processed by one or more different sections of the plurality of sections than are each other bundle of edges of the multiple bundles of edges.

15. A segmented quasi-cyclic low-density parity-check (QC-LDPC) decoder configured to implement multi-segment codeword parallel edge bundle processing:

a reconfigurable segmented shifter configurable to simultaneously separately provide shifting with respect to each message bundle of multiple bundles of edges for a first codeword using multiple segments of the reconfigurable segmented shifter and one or more bundles of edges for a second codeword using one or more segments of the reconfigurable segmented shifter, wherein the reconfigurable segmented shifter is reconfigurable with respect to a number of segments and a size of the segments for the multi-segment codeword parallel edge bundle processing, wherein the multiple bundles of edges for the first codeword comprise a first edge bundle connecting a first check node cluster (CNC) of a plurality of check nodes (CNs) for the first codeword and a first variable node cluster (VNC) of a plurality of variable nodes (VNs) for the first codeword and a second edge bundle connecting the first CNC and a second VNC of a plurality of VNs for the first codeword, and wherein the one or more bundles of edges for the second codeword comprise a first edge bundle connecting a CNC of a plurality of CNs for the second codeword and a VNC of a plurality of VNs for the second codeword; and a controller providing control signals to the reconfigurable segmented shifter controlling the shifting with respect to each message bundle of the multiple bundles of edges to process multiple bundles of edges for the first codeword and with respect to each message bundle of the one or more bundles of edges to process one or more bundles of edges for the second codeword simultaneously for decoding the first codeword and the second codeword.

* * * * *

UNITED STATES PATENT AND TRADEMARK OFFICE
CERTIFICATE OF CORRECTION

PATENT NO. : 11,575,390 B2
APPLICATION NO. : 17/367195
DATED : February 7, 2023
INVENTOR(S) : Hing-Mo Lam et al.

It is certified that error appears in the above-identified patent and that said Letters Patent is hereby corrected as shown below:

On the Title Page

Item (73) Assignee, delete "Hong Kong Applied Science and Technology Research Insitute Co., Ltd." and replace with --Hong Kong Applied Science and Technology Research Institute Co., Ltd.--.

Item (57) Abstract, Line 5, delete "(QC-LDDC)" and replace with --(QC-LDPC)--.

In the Specification

At Column 8, Line number 35, delete "message is passed" and replace with --message $E_{2,3}^{(t)}$ is passed--.

At Column 9, Line number 45, delete "$SUM_1^{(t+2)}+$" and replace with --$SUM_1^{(t+2)} =$--.

At Column 10, Line number 5, delete the very last occurrence of "$M_{1,1}^{(1)}$" and replace with --$M_{1,1}^{(2)}$--.

At Column 10, Line number 24, delete "*" and replace with --→--.

At Column 15, Line number 53, delete the first occurrence of "$E1_{1,3}^{(1)}$" and replace with --$E1_{1,2}^{(1)}$--.

At Column 20, Line number 29, delete "CNC$_i$" and replace with --CNC$_1$--.

Signed and Sealed this
Fourth Day of April, 2023

Katherine Kelly Vidal
*Director of the United States Patent and Trademark Office*